(12) United States Patent
Hashimoto et al.

(10) Patent No.: US 10,553,471 B2
(45) Date of Patent: Feb. 4, 2020

(54) SUBSTRATE CONVEYING SYSTEM AND METHOD

(71) Applicant: KAWASAKI JUKOGYO KABUSHIKI KAISHA, Kobe-shi, Hyogo (JP)

(72) Inventors: Yasuhiko Hashimoto, Kobe (JP); Takayuki Fukushima, Takarazuka (JP); Ryosuke Kanamaru, Kakogawa (JP); Shinya Kinoshita, Akashi (JP); Daiki Miyagawa, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 68 days.

(21) Appl. No.: 15/114,623

(22) PCT Filed: Jun. 27, 2014

(86) PCT No.: PCT/JP2014/067235
§ 371 (c)(1),
(2) Date: Jul. 27, 2016

(87) PCT Pub. No.: WO2015/114850
PCT Pub. Date: Aug. 6, 2015

(65) Prior Publication Data
US 2016/0351434 A1    Dec. 1, 2016

(30) Foreign Application Priority Data

Jan. 28, 2014   (JP) ................................. 2014-013216

(51) Int. Cl.
*H01L 21/677* (2006.01)
*H01L 21/687* (2006.01)
*B25J 9/04* (2006.01)

(52) U.S. Cl.
CPC ........ *H01L 21/68707* (2013.01); *B25J 9/042* (2013.01); *H01L 21/67766* (2013.01); *H01L 21/67778* (2013.01); *H01L 21/67781* (2013.01)

(58) Field of Classification Search
CPC ....................... B25J 11/0095; H01L 21/67754
See application file for complete search history.

(56) References Cited

U.S. PATENT DOCUMENTS 5,273,244 A * 12/1993 Ono .................. H01L 21/67781
                                                               211/1.57
6,481,956 B1 * 11/2002 Hofmeister .............. B25J 9/042
                                                                414/744.5
(Continued)

FOREIGN PATENT DOCUMENTS

| JP | H05-235147 A | 9/1993 |
| JP | H08-139160 A | 5/1996 |

(Continued)

OTHER PUBLICATIONS

Oct. 16, 2017 Extended Search Report issued in European Patent Application No. 14880616.9.

(Continued)

*Primary Examiner* — Jonathan Snelting
(74) *Attorney, Agent, or Firm* — Oliff PLC

(57) ABSTRACT

The end effector has a first hand and a second hand which can be driven independently from each other. The first hand has a hand body which can be inserted between vertically adjacent substrates stored in a substrate storing portion, holding a substrate immediately above or immediately below the hand body. The second hand has a hand base portion which at least partially advances below a lowermost substrate or above an uppermost substrate of a plurality of substrates stored in a substrate storing portion and a substrate holding means provided to the hand base portion so as (Continued)

to hold two or more substrates including the lowermost substrate or the uppermost substrate. By the end effector, substrates can be conveyed without any problem even when use of a batch conveying type hand is restricted due to the condition on the substrate storing portion side.

24 Claims, 18 Drawing Sheets

(56) References Cited

U.S. PATENT DOCUMENTS

| | | | |
|---|---|---|---|
| 7,618,226 | B2 | 11/2009 | Takizawa et al. |
| 8,851,821 | B2 * | 10/2014 | Mitsuyoshi .......... B65G 49/061 414/416.08 |
| 8,950,998 | B2 * | 2/2015 | Meulen ................ B65G 25/02 414/217 |
| 9,343,341 | B2 | 5/2016 | Hashimoto et al. |
| 2003/0017044 | A1 | 1/2003 | Cameron et al. |
| 2005/0123383 | A1 | 6/2005 | Goto et al. |
| 2007/0238062 | A1 * | 10/2007 | Asari ................ F27B 17/0025 432/253 |
| 2010/0290886 | A1 | 11/2010 | Hashimoto et al. |

FOREIGN PATENT DOCUMENTS

| | | |
|---|---|---|
| JP | H11-163096 A | 6/1999 |
| JP | 2925329 B2 | 7/1999 |
| JP | 2001-118909 A | 4/2001 |
| JP | 2001-291759 A | 10/2001 |
| JP | 2002-231787 A | 8/2002 |
| JP | 2003-309166 A | 10/2003 |
| JP | 2005-116807 A | 4/2005 |
| JP | 2005-340729 A | 12/2005 |
| JP | 2006-205264 A | 8/2006 |
| JP | 2010-179420 A | 8/2010 |
| KR | 2006-0135529 A | 12/2006 |
| WO | 99/48652 A1 | 9/1999 |
| WO | 2010/103876 A1 | 9/2010 |
| WO | 2013/021645 A1 | 2/2013 |

OTHER PUBLICATIONS

Aug. 2, 2016 International Preliminary Report on Patetability issued in International Patent Application No. PCT/JP2014/067235.

Sep. 22, 2014 International Search Report issued in International Patent Application No. PCT/JP2014/067235.

\* cited by examiner

SUBSTRATE CONVEYING SYSTEM AND METHOD

TECHNICAL FIELD

The present invention relates to an end effector which is mounted on a robot arm so as to hold a substrate, a substrate conveying robot having the end effector, a substrate conveying system having the substrate conveying robot, a substrate treating system with the substrate conveying system and a substrate treating device, and a substrate conveying method using the substrate conveying robot.

BACKGROUND ART

Conventionally, a substrate conveying robot with an end effector is used in order to convey a substrate (plate member) such as a wafer for producing semiconductors or a glass substrate for producing liquid crystal panels.

In the substrate conveying robot, a conveying position of the substrate is taught via a teaching device connected to a robot controller, and the robot operates repeatedly between the taught conveying positions so as to convey the substrates. For example, a wafer is taken out from a substrate storing portion (FOUP, for example) in which a plurality of wafers are stored, and the wafer is conveyed to another substrate storing portion (FOUP, for example) or a wafer treating device side.

The end effector for holding a plurality of substrates and conveying the same simultaneously is proposed (PTLs 1 to 3) in order to enhance the substrate conveying efficiency from a conveying source to a conveying destination. This type of end effector has a hand of batch conveying type having a hand base portion which at least partly advances below a plurality of substrates to be held, and a substrate holding means capable of holding a plurality of substrates.

CITATION LIST

Patent Literature

[PTL 1] Japanese Patent Application Laid-Open No. 2003-309166
[PTL 2] International Publication WO2013/021645
[PTL 3] Japanese Patent No. 2925329
[PTL 4] Japanese Patent Application Laid-Open No. H05-235147
[PTL 5] Japanese Patent Application Laid-Open No. H11-163096
[PTL 6] Japanese Patent Application Laid-Open No. 2001-118909
[PTL 7] Japanese Patent Application Laid-Open No. 2001-291759
[PTL 8] Japanese Patent Application Laid-Open No. 2005-340729

SUMMARY OF INVENTION

Technical Problem

However, in the above-mentioned batch conveying type hand, space for the hand base portion to advance below a plurality of substrates to be held is needed. Although FOUP is used in order to store a plurality of substrates (wafers) in a semiconductor producing process, the dimension of FOUP is strictly regulated by the standard. Therefore, it is extremely difficult or impossible to ensure space for the hand base portion of the batch conveying type hand below a plurality of substrates stored in FOUP.

Therefore, even when trying to carry-out the substrate in FOUP using the batch conveying type hand, the hand base portion cannot be inserted into FOUP since there is no sufficient space below a plurality of substrates in FOUP, and therefore it is impossible to carry-out the substrate. Also, the batch conveying type hand cannot access the lower end region in FOUP when conveying the substrate into FOUP as well, and therefore the batch conveying type hand cannot be used.

The present invention is made considering the above-mentioned problems of the conventional art and its object is to provide an end effector capable of conveying the substrate using the batch conveying type hand without any problem even when use of the batch conveying type hand is restricted due to circumstances of the substrate storing portion side, a substrate conveying robot having the end effector, a substrate conveying system having the substrate conveying robot, a substrate treating system equipped with the substrate conveying system and a substrate treating device, and a substrate conveying method using the substrate conveying robot.

Solution to Problem

In order to achieve the above-mentioned objects, the present invention according to a first aspect is an end effector mounted on a robot arm, comprising independently drivable first and second hands, wherein the first hand has a hand body insertable between vertically adjacent substrates stored in a substrate storing portion, the first hand being configured to hold a substrate immediately above or immediately below the hand body inserted between the vertically adjacent substrates, and wherein the second hand has a hand base portion which at least partially advances below a lowermost substrate or above an uppermost substrate of a plurality of substrates stored in the substrate storing portion and a substrate holding means provided to the hand base portion so as to hold two or more substrates including the lowermost substrate or the uppermost substrate.

The present invention according to a second aspect is that, in the invention according to the first aspect, the first and second hands are each switchable between an operative position upon accessing the substrate storing portion and a retreat position upon not accessing the substrate storing portion.

The present invention according to a third aspect is that, in the invention according to the first or second aspect, the substrate holding means has a plurality of substrate supporting portions for supporting each bottom surface edge portion of the two or more substrates, the substrate supporting portions being arranged at different heights in a vertical direction at least in a substrate holding state.

The present invention according to a fourth aspect is that, in the invention according to the third aspect, the plurality of substrate supporting portions are changeable in vertical pitch, wherein the substrate holding means is configured to change in height in accordance with change in the vertical pitch of the plurality of substrate supporting portions.

The present invention according to a fifth aspect is that, in the present invention according to the third of fourth aspect, the plurality of substrate supporting portions are arranged to positions where they do not overlap each other at least partially in a view from a moving direction of the substrate supporting portion.

The present invention according to a sixth aspect is that, in the invention according to the fifth aspect, the plurality of substrate supporting portions are changeable in vertical pitch, wherein positions of the plurality of substrate supporting portions in a view from the vertical direction do not change even when the vertical pitch is changed.

The present invention according to a seventh aspect is that, in the invention according to any one of the first to sixth aspects, the first hand has the plurality of hand bodies.

The present invention according to an eighth aspect is that, in the invention according to the seventh aspect, the plurality of hand bodies are changeable in vertical pitch.

The present invention according to a ninth aspect is that, in the invention according to any one of the first to eighth aspects, a diameter of the substrate is 300 mm, the number of substrates to be held by the second hand is five, and, of the whole second hand, a height of a part which passes a region overlapping with the substrate stored in the substrate storing portion in a view of the vertical direction when conveying the substrate is 60 mm or less.

The present invention according to a tenth aspect is that, in the invention according to any one of the first to eighth aspects, a diameter of the substrate is 450 mm, the number of substrates to be held by the second hand is five, and, of the whole second hand, a height of a part which passes a region overlapping with the substrate stored in the substrate storing portion in a view of the vertical direction when conveying a substrate is 72 mm or less.

A substrate conveying robot of the present invention according to an eleventh aspect comprises the end effector of the invention according to any one of the first to tenth aspects, and a robot arm on which the end effector is mounted.

A substrate treating system of the present invention according to a twelfth aspect comprises a substrate conveying system including the substrate conveying robot according to the eleventh aspect, and a substrate treating device for treating a substrate conveyed by the substrate conveying system.

The present invention according to a thirteenth aspect is a substrate conveying system comprising the substrate conveying robot of the invention according to the eleventh aspect and the substrate storing portion for storing a plurality of substrates, wherein H>h and (N−M)=n×(positive integer) is established, where the number of substrates to be stored in the substrate storing portion is N, the number of substrates to be carried out by the first hand from one vertical end region of the substrate storing portion is M, the number of substrates to be held by the second hand is n, a height of a space formed in the one end region of the substrate storing portion when M-number of substrates are carried out by the first hand is H, and a height of a part, of the whole second hand, which passes a region overlapping with the substrate stored in the substrate storing portion in a view of the vertical direction when conveying the substrate is h.

The present invention according to a fourteenth aspect is a substrate conveying method using the substrate conveying robot of the present invention according to the eleventh aspect comprising a first conveying step for carrying-out one or a plurality of substrates in one vertical end region of the substrate storing portion of a conveying source by the first hand, and a second conveying step for carrying-out a plurality of substrates simultaneously by inserting the second hand into the one end region where the one or plurality of substrates has/have been carried out according to the first conveying step.

The present invention according to a fifteenth aspect is that, in the present invention according to the fourteenth aspect, all of substrates left in the substrate storing portion of the conveying source after the first conveying step are carried out by the second hand.

The present invention according to a sixteenth aspect satisfies M=N−n×(positive integer), in the present invention according to the fourteenth aspect, where the number of substrates to be carried out by the first hand in the first conveying step is M, the number of substrates to be stored in the substrate storing portion is N, and the number of substrates to be held by the second hand is n.

The present invention according to a seventeenth aspect is that M=5, n=5 in the present invention according to the sixteenth aspect.

The present invention according to an eighteenth aspect is that, in the present invention according to any one of the fourteenth to seventeenth aspects, a substrate carried out from the one end region of the substrate storing portion of the conveying source in the first conveying step is carried into one vertical end region in a substrate storing portion of a conveying destination, wherein the one end region in the substrate storing portion of the conveying source and the one end region in the substrate storing portion of the conveying destination are vertically opposite end regions.

The present invention according to a nineteenth aspect is that, in the present invention according to the fourteenth aspect, a part of the substrates left in the substrate storing portion of the conveying source after the first conveying step is carried out by the second hand and carried into a vertically intermediate region in a substrate storing portion of a conveying destination, wherein a substrate left in the other vertical end region in the substrate storing portion of the conveying source is carried out by the first hand and carried into one vertical end region in the substrate storing portion of a conveying destination, and wherein the one end region in the substrate storing portion of the conveying source and the one end region in the substrate storing portion of the conveying destination are vertically opposite end regions.

The present invention according to a twentieth aspect is that, in the invention according to any one of the fourteenth to nineteenth aspects, the end effector is the end effector of the invention according to the fourth aspect, wherein in the second conveying step, a height of the substrate holding means is set to a height lower than its maximum height when firstly inserting the second hand into the one end region of the substrate storing portion of the conveying source.

The present invention according to a 21st aspect is that, in the invention according to the twentieth aspect, when the second hand is inserted into an inside of the substrate storing portion twice or more after the first conveying step, the vertical pitch of the plurality of substrate supporting portions is set to be a maximum pitch upon insertion of second time or after.

The substrate conveying robot of the invention according to a 22nd aspect comprises a first robot arm, a second robot arm drivable independently from the first robot arm, a first hand mounted on the first robot arm, and a second hand drivable independently from the first hand and mounted on the second robot arm, wherein the first hand has a hand body insertable between vertically adjacent substrates stored in a substrate storing portion, the first hand being configured to hold a substrate immediately above or immediately below the hand body which is inserted between the vertically adjacent substrates, and wherein the second hand has a hand base portion which at least partially advances below a lowermost substrate or above an uppermost substrate of a plurality of substrates stored in the substrate storing portion, and a substrate holding means provided to the hand base portion so as to hold two or more substrates including the lowermost substrate or the uppermost substrate.

The present invention according to a 23rd aspect is a substrate conveying system comprising a first substrate conveying robot and a second substrate conveying robot, wherein the first substrate conveying robot has a first robot arm on which a first hand is mounted, wherein the first hand has a hand body insertable between vertically adjacent substrates stored in a substrate storing portion, the first hand being configured to hold a substrate immediately above or immediately below the hand body inserted between the vertically adjacent substrates, wherein the second substrate conveying robot has a second robot arm on which a second hand in mounted, and wherein the second hand has a hand base portion which at least partially advances below a lowermost substrate or above an uppermost substrate of a plurality of substrates stored in the substrate storing portion, and a substrate holding means provided to the hand base portion so as to hold two or more substrates including the lowermost substrate or the uppermost substrate.

The present invention according to a 24th aspect is an end effector to be mounted on a robot arm comprising independently drivable first and second hands, wherein the first hand has a hand body insertable between vertically adjacent substrates stored in a substrate storing portion, the first hand being configured to hold a substrate immediately above or immediately below the hand body inserted between the vertically adjacent substrates, and wherein the second hand has a hand base portion which at least partially advances below a lowermost substrate or above an uppermost substrate of a plurality of substrates stored in the substrate storing portion, and a substrate holding means extendable in a vertical direction over a range including two or more substrates stored in the substrate storing portion in a state that the hand base portion is at least partially positioned below the lowermost substrate or above the uppermost substrate.

The present invention according to a 25th aspect is that the state that the substrate holding means is extended in the vertical direction over the range including two or more substrates stored in the substrate storing portion can be achieved without moving the hand base portion in a vertical direction in the state that the hand base portion is at least partially positioned below the lowermost substrate or above the uppermost substrate.

Note that, in the description, "upper (upper side, upward)" and "lower (lower side, downward)" refer to the top surface side of a substrate and the bottom surface side of the substrate respectively, in a direction perpendicular to the surface of the substrate held by an end effector.

Advantageous Effect of Invention

According to the invention, a substrate can be conveyed without any problem using a batch conveying type hand even when use of the batch conveying type hand is restricted for some reason on the substrate storing portion side.

DESCRIPTION OF EMBODIMENTS

Hereunder, a substrate conveying system and a substrate conveying method comprising a substrate conveying robot according to an embodiment of the present invention will be described referring to the figures.

Note that, although the embodiment relates to a conveying of a wafer (substrate) for producing semiconductors, a substrate as an object to be conveyed by the substrate conveying robot of the invention is not limited to a wafer for producing semiconductors and includes various substrates (plate-shaped members) such as a glass substrate for producing liquid crystal panels.

Figure 1:
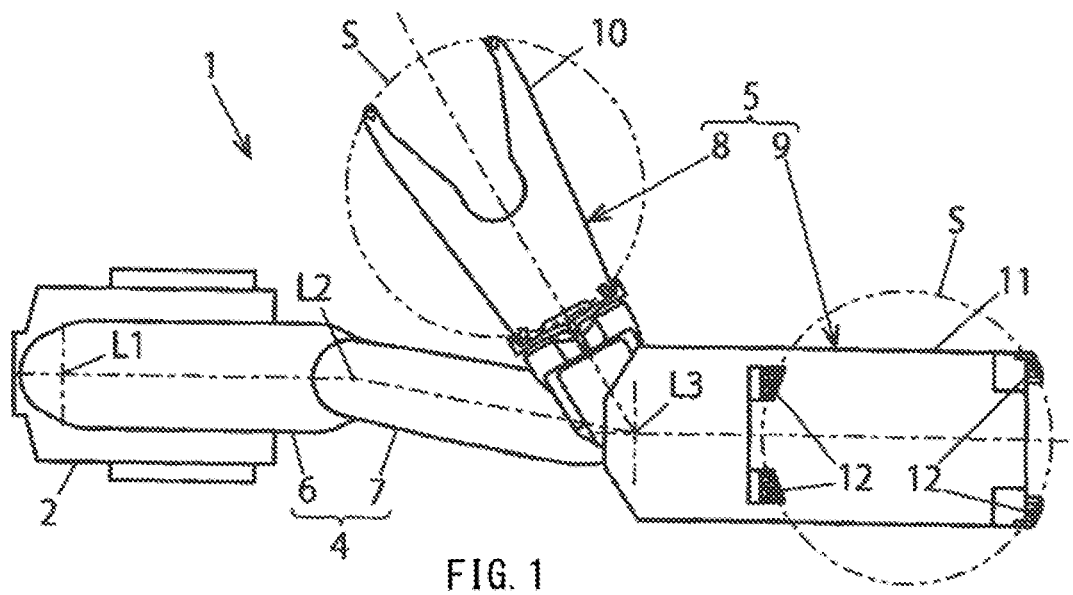
FIG. 1 is a plan view illustrating a substrate conveying robot according to an embodiment of the present invention.
Figure 2:
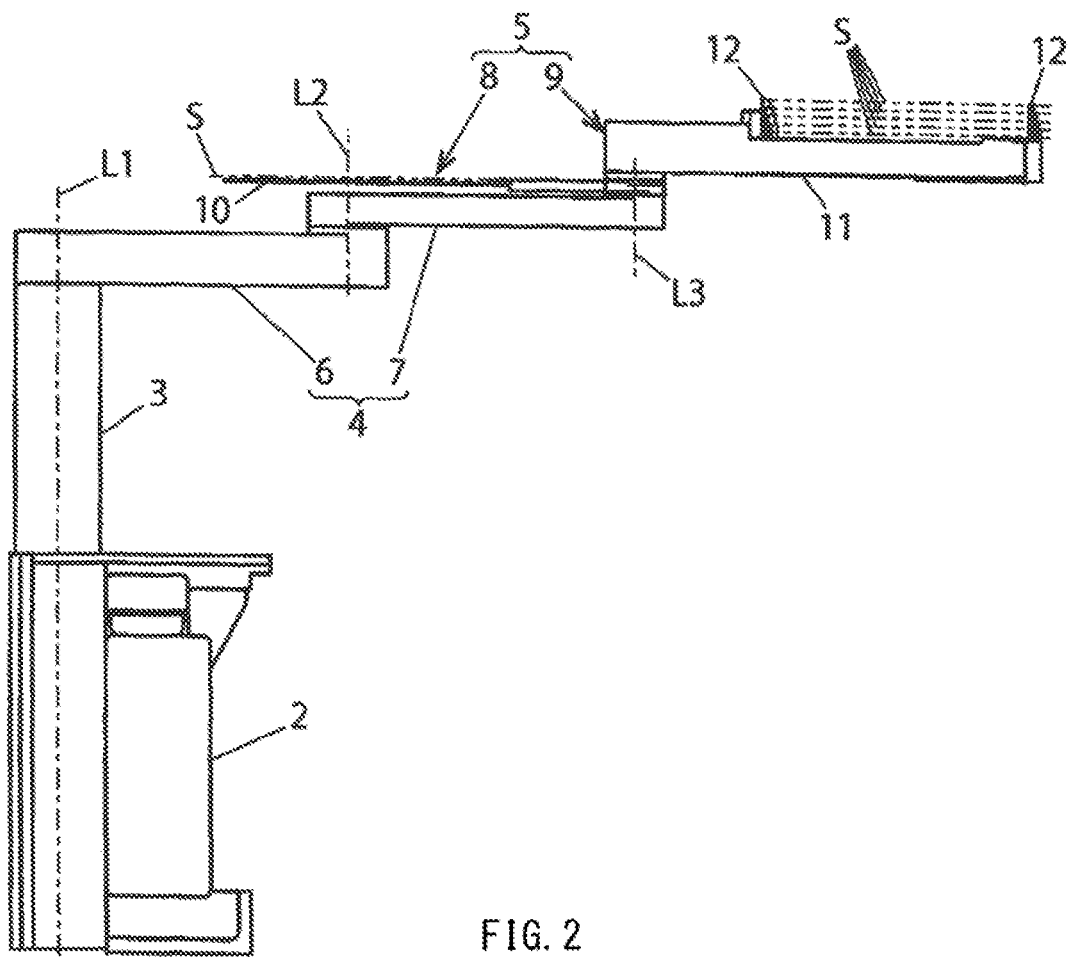
FIG. 2 is a side view of the substrate conveying robot in FIG. 1.

As illustrated in FIGS. 1 and 2, the substrate conveying robot 1 according to the embodiment comprises a base 2, and a main shaft 3 provided on the base 2 liftably along a first axial line L1, a robot arm 4 whose proximal end portion is connected to an upper end portion of the main shaft 3, and an end effector 5 connected to a distal end portion of the robot arm 4. The robot arm 4 has a first arm member 6 including the proximal end portion of the robot arm 4 and a second arm member 7 including a distal end portion of the robot arm 4, and a distal end portion of the first arm member 6 and a proximal end portion of the second arm member 7 are rotatably connected to each other about a second axial line L2.

The end effector 5 has a blade hand (first hand) 8 which is connected to a distal end portion of the second arm member 7 rotatably about a third axial line L3 and a batch conveying type hand (second hand) 9 which is also connected to the distal end portion of the second arm member 7 rotatably about the third axial line L3. Note that, although the batch conveying type hand 9 is in an upper position and the blade hand 8 is in a lower position in the example, they can be switched in the vertical position.

The blade hand 8 has a hand body 10 which can be inserted between vertically adjacent substrates stored in a substrate storing portion. Note that, although the hand body 10 is configured by a plate-shaped body in the embodiment, a member configuring the hand body is not limited to the plate-shaped body and it may be configured by a rod-shaped body, for example, including a wide range of what can be inserted between vertically adjacent substrates stored in a substrate storing portion. The batch conveying type hand 9 has a hand base portion 11 which at least partially advances below a plurality of substrates stored in the substrate storing portion, and a substrate holding means 12 which is provided to the hand base portion so as to hold a plurality of substrates (wafers) S.

As illustrated in FIG. 2, the hand base portion 11 of the batch conveying type hand 9 is considerably thicker than the hand body 10 of the blade hand 8, having a thickness that being inserted between vertically adjacent substrates stored in the substrate storing portion such as FOUP is generally impossible.

Note that, as illustrated in FIGS. 1 and 2, the embodiment is configured to hold the substrate S on an upper surface side of each of the blade hand 8 and the batch conveying type hand 9, and it is particularly effective when adhesion of particles should be prevented in a semiconductor wafer, for example.

The blade hand 8 and the batch conveying type hand 9 can be independently driven respectively about the third axial line L3. Thereby, each of the blade hand 8 and the batch conveying type hand 9 can be switched between an operative position upon accessing the substrate storing portion and a retreat position upon not accessing the substrate storing portion.

Figure 3:
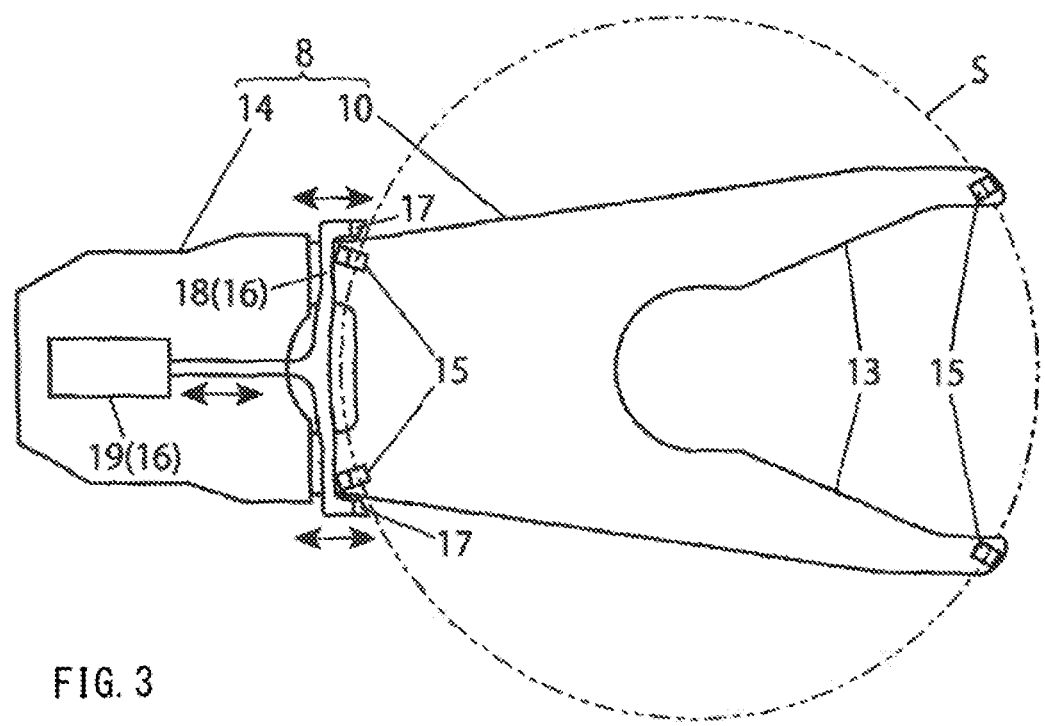
FIG. 3 is a plan view illustrating a blade hand (first hand) of the substrate conveying robot in FIG. 1.

As illustrated in FIG. 3, the blade hand 8 has the hand body 10 on whose distal end side a pair of finger portions 13 are formed and a hand base portion 14 to which a proximal end portion of the hand body 10 is connected. A substrate supporting portion 15 for supporting a bottom surface edge portion of the substrate S is provided to each distal end portion of a pair of finger portions 13. The substrate supporting portion 15 for supporting the bottom surface edge portion of the substrate S is also provided to each lateral side of the proximal end portion of the hand body 10.

Further, the blade hand 8 comprises a gripping means 16 for gripping the substrate S placed on the substrate supporting portions 15. The gripping means 16 has a movable member 18 including a pair of right and left abutting portions 17 abutted to the sides of the substrate S and a drive source (air cylinder, for example) 19 for driving the movable member 18 back and forth. By moving the movable portion 18 forward so as to press the abutting portions 17 to the side surfaces of the substrate, the substrate S is gripped by the pair of abutting portions 17 and vertical wall parts of a pair of substrate supporting portions 15 on the distal end portion.

Figure 4:
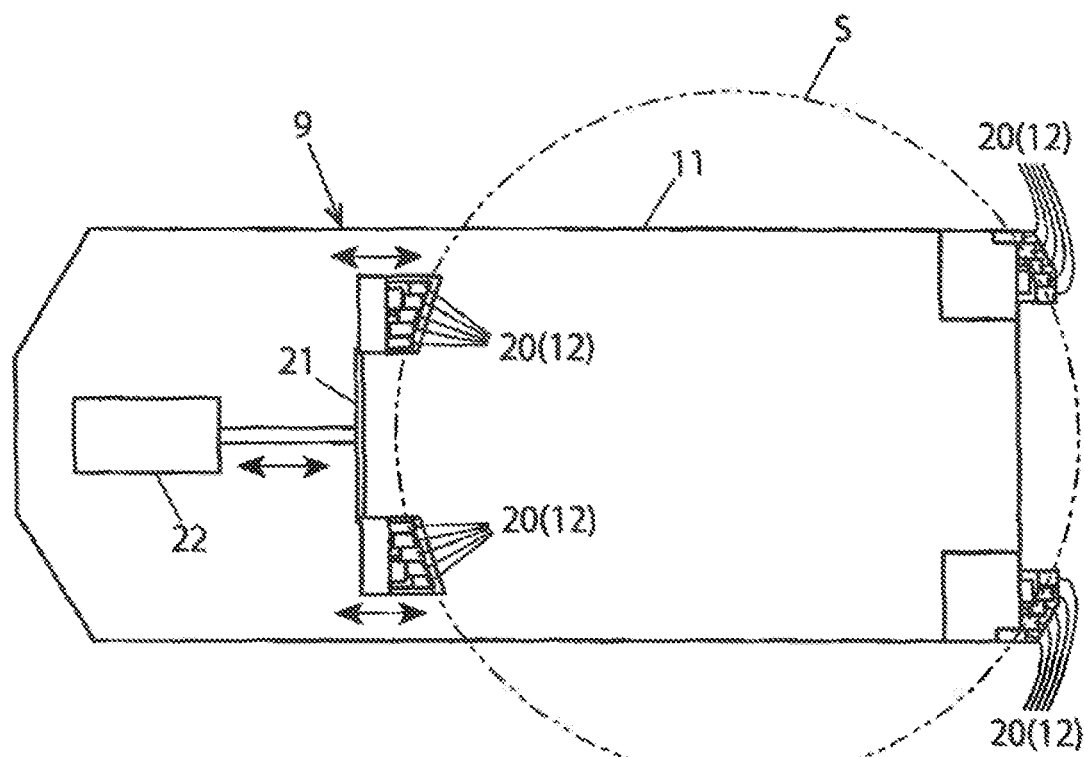
FIG. 4 is a plan view illustrating a batch conveying type hand (second hand) of the substrate conveying robot in FIG. 1.

As illustrated in FIG. 4, the substrate holding means 12 of the batch conveying type hand 9 comprises groups of substrate supporting portions composed of a plurality of (five in the example) substrate supporting portions 20 each for supporting a bottom surface edge portion of a corresponding one of a plurality of (five in the example) substrates S on the right and left of the distal end side of the hand base portion 11 and on the right and left of the opposite side in between the substrate S, respectively. A group of substrate supporting portions 20 on the proximal end side of the hand base portion 11 is provided integrally with the movable member 21 so as to move back and forth. The movable member 21 is driven back and forth by a drive source (air cylinder, for example) 22.

Figure 5A:
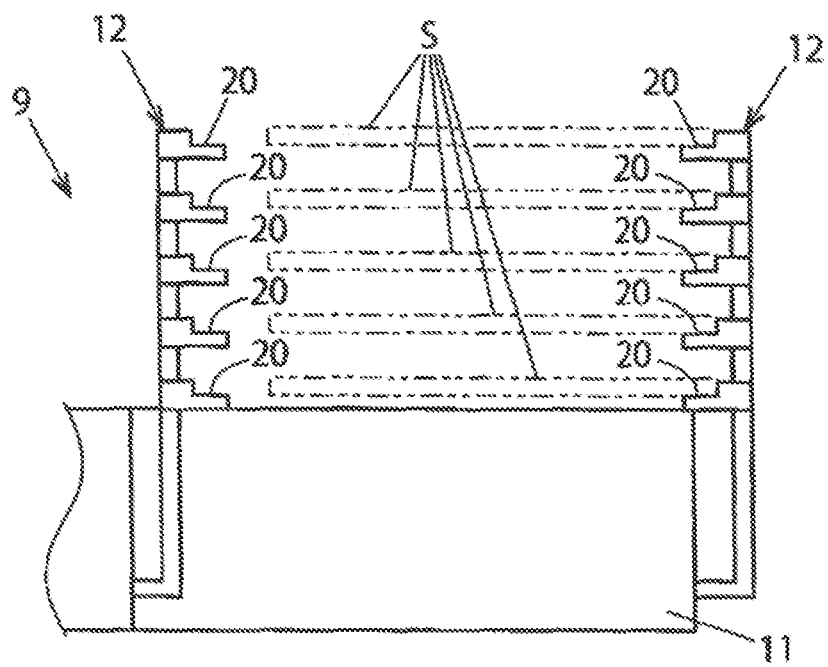
FIG. 5A is a schematic view illustrating operating of the batch conveying type hand illustrated in FIG. 4.
Figure 5B:
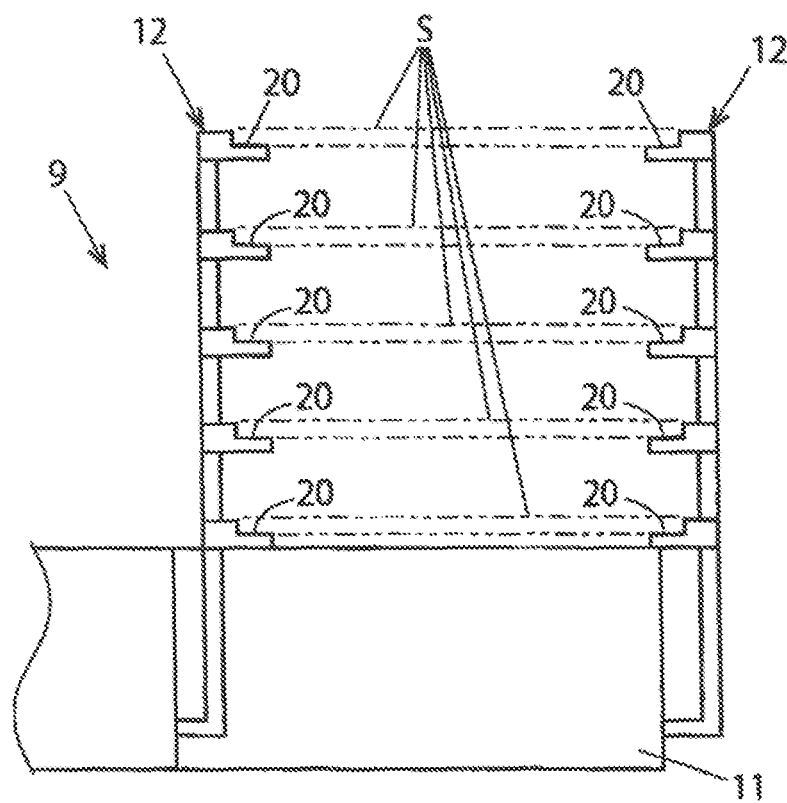
FIG. 5B is another schematic view illustrating operation of the batch conveying type hand in FIG. 4.

As illustrated in FIGS. 5A and 5B, the plurality of (five in the example) substrate supporting portions 20 belonging to each group are arranged at different heights in the vertical direction at least in a substrate holding state.

When gripping the substrate S by the substrate supporting portions 20 on the distal end side and the substrate supporting portions 20 on the proximal end side, the movable member 21 is moved forward by the drive force 22 so as to press the vertical wall parts of the substrate supporting portions 20 on the proximal end side to the side surface of the substrate. Thereby the substrate S is clamped by the vertical wall parts of the substrate supporting portions 20 on the proximal end side and the vertical wall parts of the substrate supporting portions 20 on the distal end side.

Figure 6A:
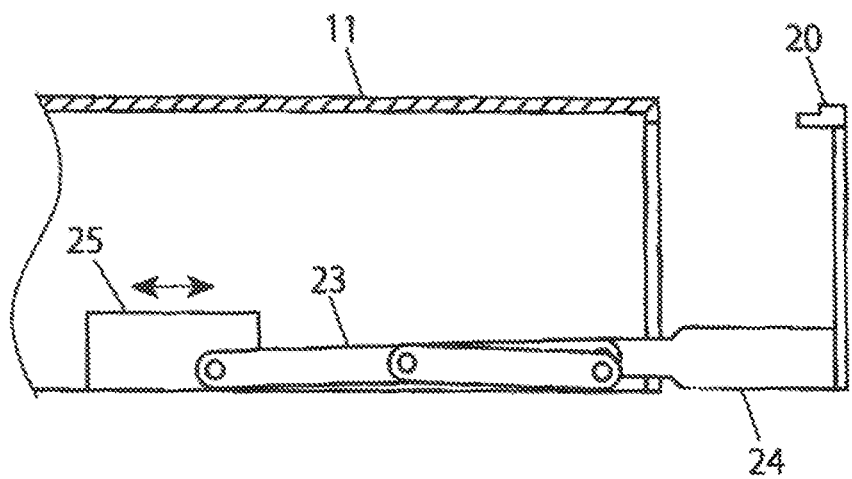
FIG. 6A is a schematic view illustrating operation of a substrate supporting means of the batch conveying type hand in FIG. 4.
Figure 6B:
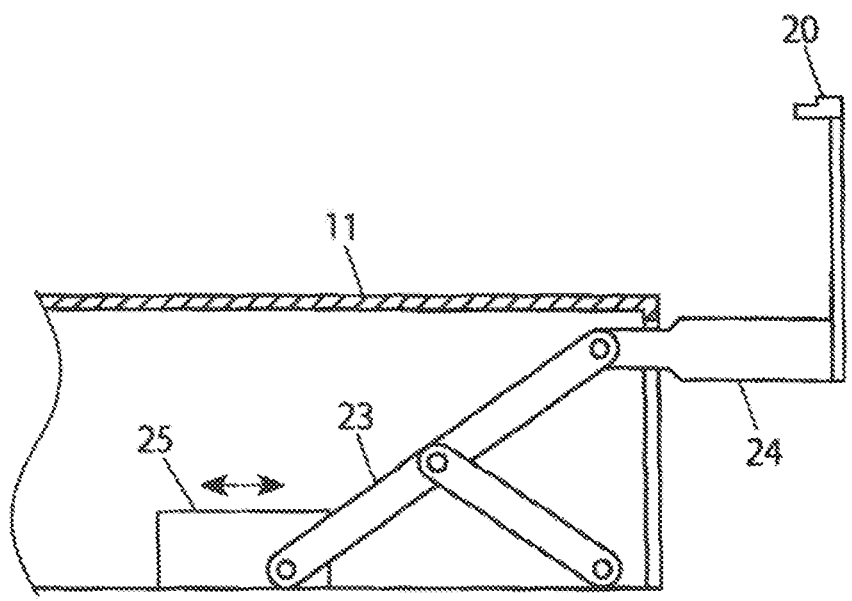
FIG. 6B is another schematic view illustrating operation of the substrate supporting means of the batch conveying type hand in FIG. 4.

In the embodiment, vertical pitch of the plurality of substrate supporting portions 20 belonging to each group can be changed. Specifically, as illustrated in FIGS. 6A and 6B, a lower end portion of the substrate supporting portion 20 is connected to a liftable member 24 connected to a lifting link mechanism 23 provided to the inside of the hand base portion 11. By driving the lifting link mechanism 23 by a slider 25, the liftable member 24 is lifted and lowered integrally with the substrate supporting portion 20 while maintaining its horizontal extending state.

The lifting link mechanism 23, the liftable member 24, and the slider 25 configure a substrate supporting portion drive means for moving the substrate supporting portion 20 between the upper position and the lower position. Pitch in the vertical direction of the plurality of substrate supporting portions 20 can be changed by the substrate supporting portion drive means.

Also, the embodiment is configured so that a height of each substrate holding means 12 configured by the plurality of substrate supporting portions 20, namely a distance from the upper surface of the hand base portion 11 to the upper end of the substrate supporting portion 20 at the highest position is changed according to change of vertical pitch of the plurality of substrate supporting portions 20 belonging to each group. The height of each substrate holding means 12 becomes lower when setting the vertical pitch of the plurality of substrate supporting portions 20 smaller (FIG. 5A) and becomes higher when setting the same larger (FIG. 5B).

The plurality of substrate supporting portions 20 may be arranged so that all of the plurality of substrate supporting portions 20 belonging to each group at least partially overlap each other in a view from at least a direction orthogonal to the vertical direction when the substrate supporting portions 20 are set to their respective lowest position. At this time, it is preferable that the upper end of the substrate supporting portion 20 at the highest position of the plurality of substrate supporting portions 20 becomes substantially as high as the height of the upper surface of the hand base portion 11 (refer to FIG. 6A) or becomes lower than the same. Note that, when all of the substrate supporting portions 20 belonging to each group are set to their respective lowest positions, the upper ends of all of the substrate supporting portions 20 belonging to each group may be flush with each other.

In the embodiment, as illustrated in FIG. 4, the plurality of substrate supporting portions 20 belonging to each group are arranged to positions where they do not overlap with each other at least partially in a view from the moving direction of the substrate supporting portion 20. Specifically, positions of the plurality of substrate supporting portions 20 in a view from the vertical direction are offset from each other in a circumferential direction of the substrate S. Further, positions of the plurality of substrate supporting portions 20 in a view from the vertical direction do not change even when vertical pitch of the plurality of substrate supporting portions 20 are changed.

Here, parts which do not overlap with each other in a view from the moving direction of the substrate supporting portion 20 may be parts, of the substrate supporting portion 20, which are contacted with the substrate (wafer) S. Also, the plurality of substrate supporting portions 20 belonging to each group may be arranged to positions where they do not overlap with each other at least partially in a view from the moving direction of the substrate supporting portion 20 at least in their respective lowest positions. Further, the plurality of substrate supporting portions 20 belonging to each group may be arranged to positions where they do not overlap with each other at least partially in a view from the moving direction of the substrate supporting portion 20 in all operative ranges during operation.

Next, a method for conveying the substrate S using the substrate conveying robot 1 according to the embodiment will be described referring to the figures.

In the semiconductor production process, for example, the substrate (wafer) S is subjected to predetermined treatment (heat treatment, deposition treatment, or the like) in various treatment devices, when the substrate conveying robot 1 carries an untreated substrate into a treatment device side and carries out a treated substrate from the treatment device side. Specifically, an untreated substrate stored in FOUP as a substrate storing portion of a conveying source is carried out from FOUP by the substrate conveying robot 1 and carried into a substrate storing portion of a conveying destination arranged on a treatment device side. A treated substrate is carried out from the treatment device side by the substrate conveying robot 1 and carried into FOUP.

Note that, a substrate storing pitch of FOUP for storing a wafer with a diameter of 300 mm is 10 mm, and a thickness of the wafer is 775 μm. Also, a substrate storing pitch of FOUP for storing a wafer with a diameter of 450 mm is 12 mm, and a thickness of the wafer is 925 μm.

A substrate conveying method using the substrate conveying robot 1 according to the embodiment comprises a first conveying step for carrying-out one or a plurality of substrates (wafers) present in a lower end region of FOUP (substrate storing portion) by the blade hand 8, and a second conveying step for inserting the batch conveying type hand 9 into the lower end region of FOUP from which one or the plurality of substrates S are carried out according to the first conveying step so as to carryout a plurality of substrates S simultaneously.

FIGS. 7A to 7L illustrate that 25 substrates (wafers) S stored in FOUP 26 as a substrate storing portion of a conveying source are carried out using the substrate conveying robot 1.

Figure 7A:
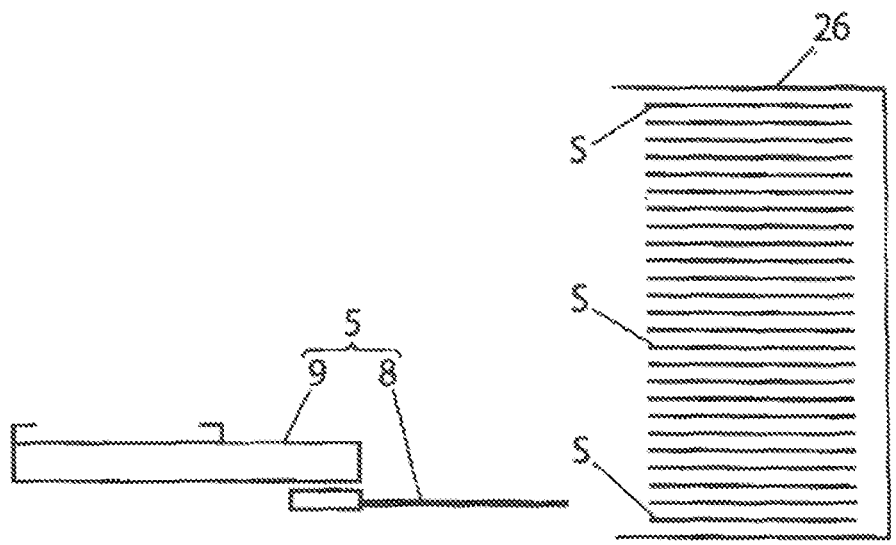
FIG. 7A is a schematic view illustrating a process for carrying-out a substrate from a substrate storing portion (FOUP) of a conveying source using the substrate conveying robot in FIG. 1.
Figure 7B:
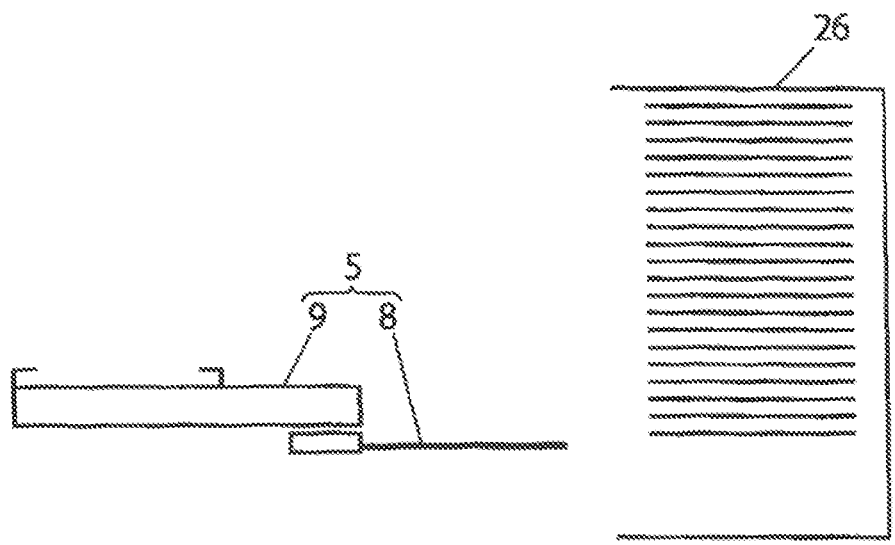
FIG. 7B is another schematic view illustrating a process for carrying-out a substrate from the substrate storing portion (FOUP) of a conveying source using the substrate conveying robot in FIG. 1.

As illustrated in FIGS. 7A and 7B, in the first conveying step, the blade hand 8 of the end effector 5 is in an operative position, and the batch conveying type hand 9 is in a retreat position. Then, the blade hand 8 in the operative position is inserted into FOUP 26 so as to carry-out a substrate S stored in the lowest position of FOUP 26 first. Subsequently, the second substrate, the third substrate, the fourth substrate, and the fifth substrate from the bottom are carried out one by one in order. By the first conveying step, a space is formed in the lower end region inside FOUP 26 as illustrated in FIG. 7B.

Figure 7C:
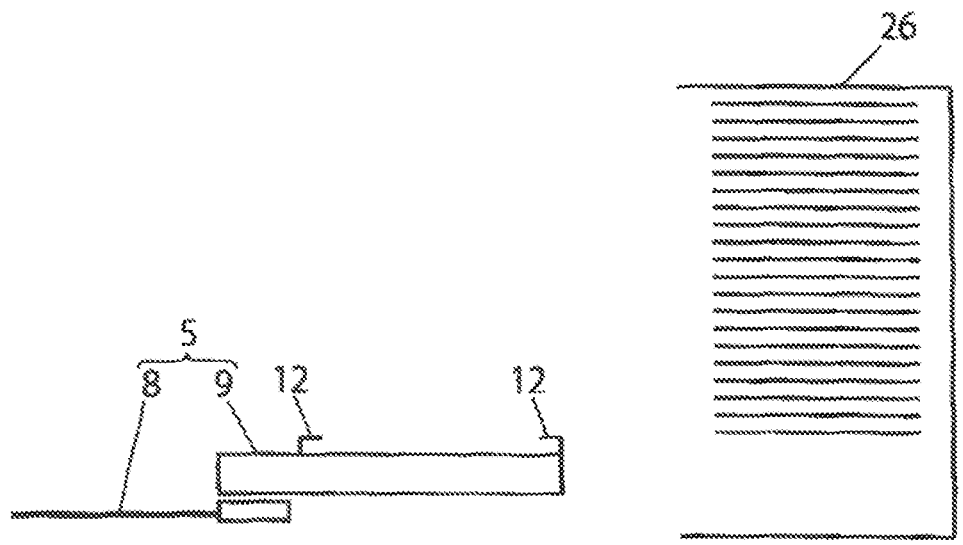
FIG. 7C is another schematic view illustrating a process for carrying-out a substrate from the substrate storing portion (FOUP) of a conveying source using the substrate conveying robot in FIG. 1.
Figure 7D:
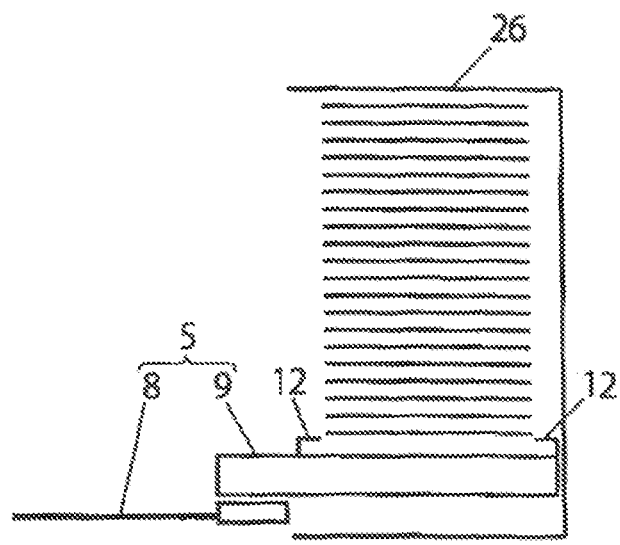
FIG. 7D is another schematic view illustrating a process for carrying-out a substrate from the substrate storing portion (FOUP) of a conveying source using the substrate conveying robot in FIG. 1.

Next, in the second conveying step, as illustrated in FIG. 7C, positions of the blade hand 8 and the batch conveying type hand 9 are switched so that the batch conveying type hand 9 is positioned in the operative position and the blade hand 8 is positioned in the retreat position. In addition, the height of the substrate holding means 12 of the batch conveying type hand 9 is set to a height lower than its maximum height, preferably the lowest height. In this state, the batch conveying type hand 9 is inserted into a space in the lower end region inside FOUP 26, as illustrated in FIG. 7D.

Figure 7E:
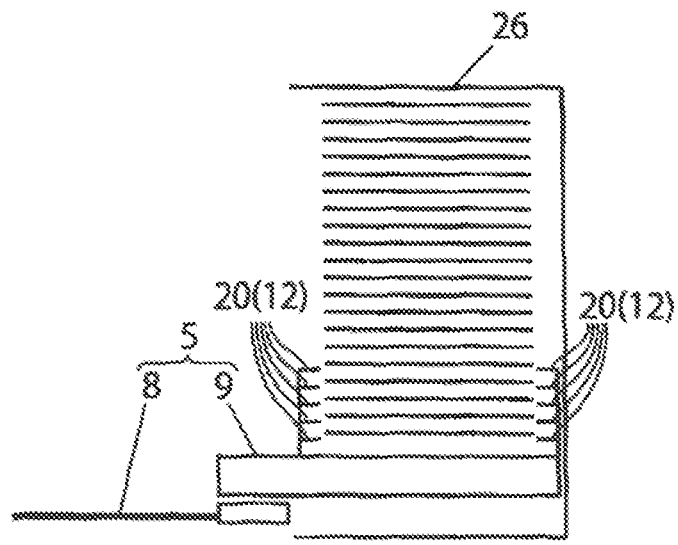
FIG. 7E is another schematic view illustrating a process for carrying-out a substrate from the substrate storing portion (FOUP) of a conveying source using the substrate conveying robot in FIG. 1.
Figure 7F:
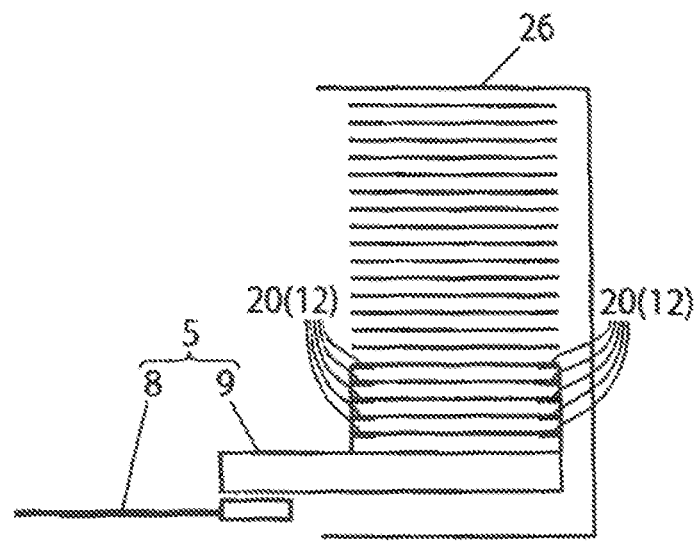
FIG. 7F is another schematic view illustrating a process for carrying-out a substrate from the substrate storing portion (FOUP) of a conveying source using the substrate conveying robot in FIG. 1.

Subsequently, as illustrated in FIG. 7E, the height of the substrate conveying means 12 is heightened and the vertical pitch of the plurality of substrate supporting portions 20 are enlarged in accordance with a vertical pitch of the plurality of substrates S stored inside FOUP 26. Preferably, the maximum pitch of the plurality of substrate supporting portions 20 corresponds to the vertical pitch of the plurality of substrates S stored in FOUP 26. Then, as illustrated in FIG. 7F, the plurality of substrates S are held by the plurality of substrate supporting portions 20 so as to be carried out from inside FOUP 26 simultaneously.

Figure 7G:
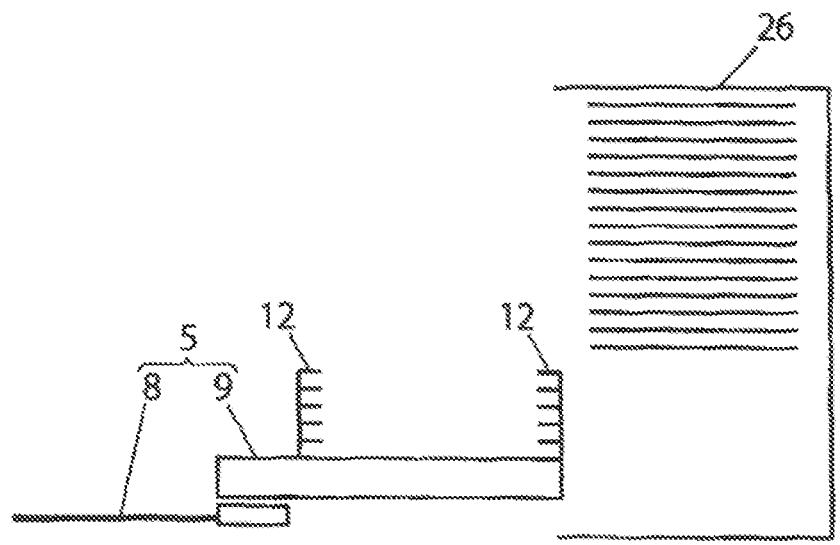
FIG. 7G is another schematic view illustrating a process for carrying-out a substrate from the substrate storing portion (FOUP) of a conveying source using the substrate conveying robot in FIG. 1.
Figure 7H:
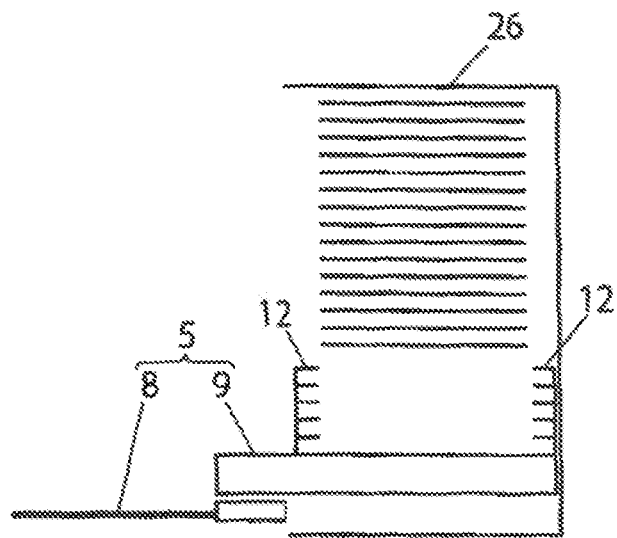
FIG. 7H is another schematic view illustrating a process for carrying-out a substrate from the substrate storing portion (FOUP) of a conveying source using the substrate conveying robot in FIG. 1.
Figure 7I:
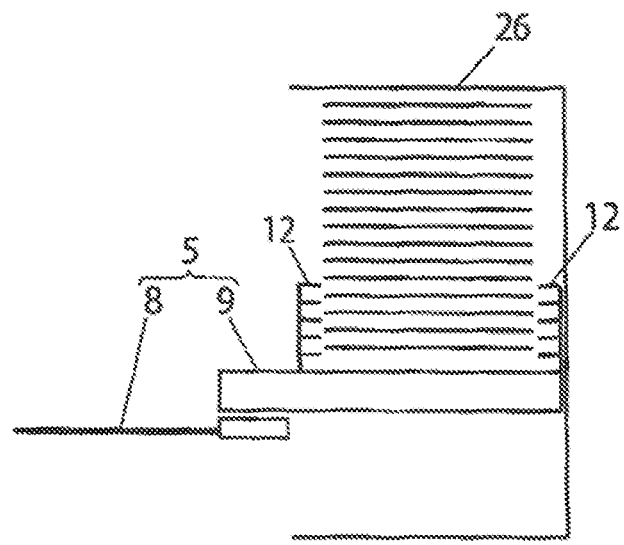
FIG. 7I is another schematic view illustrating a process for carrying-out a substrate from the substrate storing portion (FOUP) of a conveying source using the substrate conveying robot in FIG. 1.
Figure 7J:
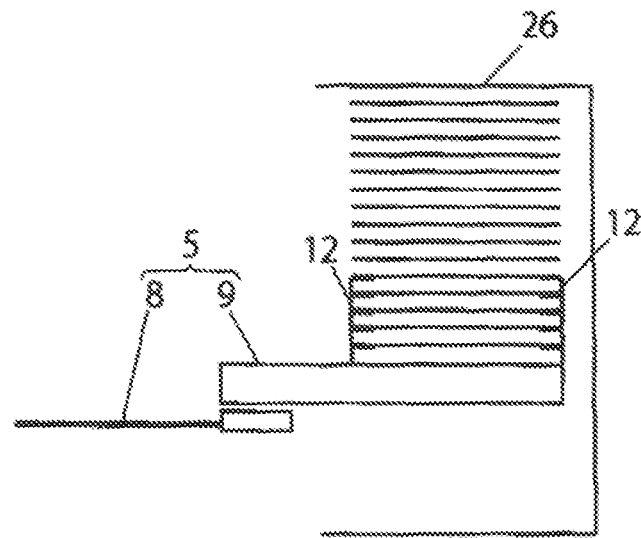
FIG. 7J is another schematic view illustrating a process for carrying-out a substrate from the substrate storing portion (FOUP) of a conveying source using the substrate conveying robot in FIG. 1.

Then, in the second or later conveyance using the batch conveying type hand 9, the height of the substrate holding means 12 is previously heightened as illustrated in FIG. 7G, and in this state, the batch conveying type hand 9 is inserted into FOUP 26 as illustrated in FIG. 7H. Subsequently, the end effector 5 is lifted so as to hold a plurality of substrates S as illustrated in FIG. 7J and they are carried out simultaneously.

By previously heightening the height of the substrate holding means 12 preceding insertion into FOUP 26, height change operation of the substrate holding means 26 in FOUP 26 is made unnecessary, and thereby working time can be reduced.

Figure 7K:
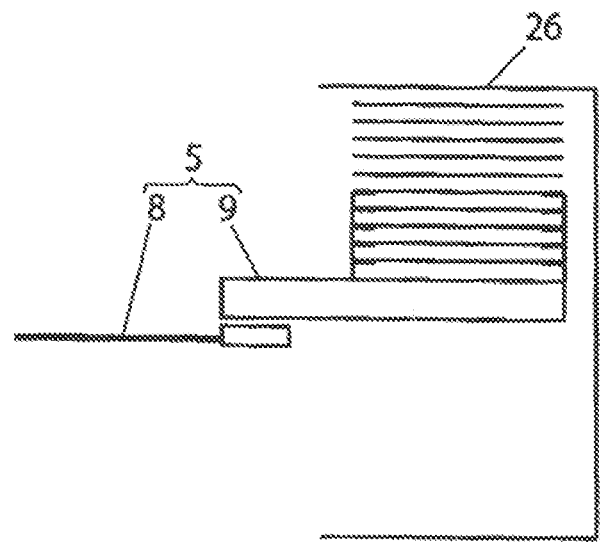
FIG. 7K is another schematic view illustrating a process for carrying-out a substrate from the substrate storing portion (FOUP) of a conveying source using the substrate conveying robot in FIG. 1.
Figure 7L:
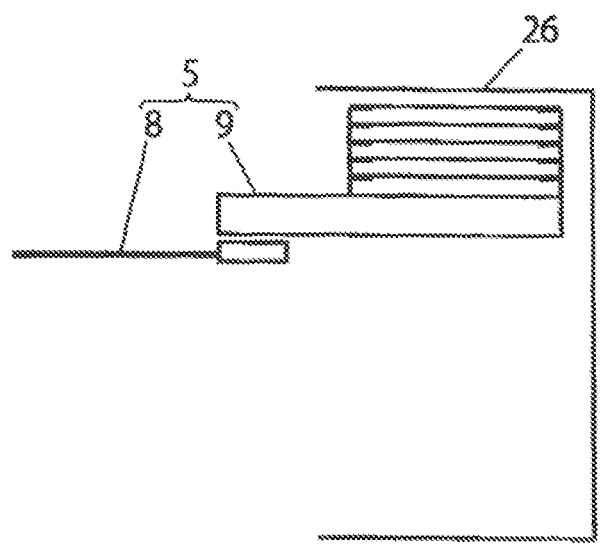
FIG. 7L is another schematic view illustrating a process for carrying-out a substrate from the substrate storing portion (FOUP) of a conveying source using the substrate conveying robot in FIG. 1.

FIG. 7K illustrates the third conveyance by the batch conveying type hand 9, and FIG. 7L illustrates the fourth conveyance by the batch conveying type hand 9. These conveyances are also performed by the same operation as the second conveyance by the batch conveying type hand 9 illustrated in FIGS. 7G to 7J.

In the embodiment, all of the substrates S left in FOUP 26 after the first conveying step are conveyed the batch conveying type hand 9.

Figure 8:
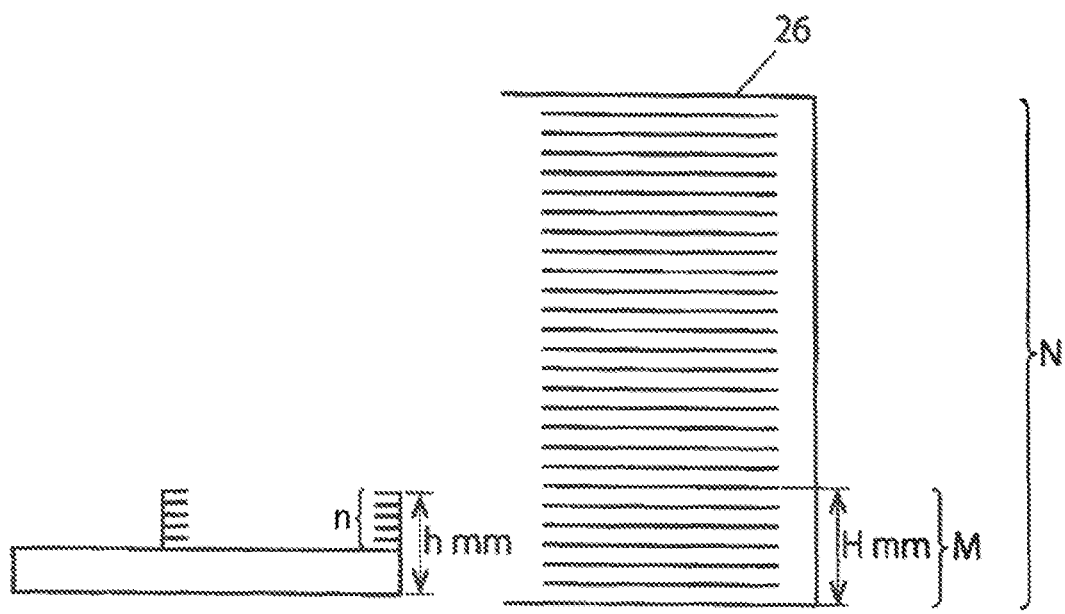
FIG. 8 is a schematic view illustrating a substrate conveying system including the substrate conveying robot in FIG. 1.

In a substrate conveying system including the substrate conveying robot 1 and FOUP 26 according to the present invention, M=N−n×(positive integer) is established, where the number of substrates S to be carried out by the blade hand 8 in the first conveying step is M, the number of substrates to be stored in FOUP is N, and the number of substrates to be held by the batch conveying type hand is n, as illustrated in FIG. 8. Thereby, an insertion space for the batch conveying type hand 9 provided in the lower end region in the substrate storing portion of the conveying destination can be minimized.

Also, H>h is established, where a height of a space formed in the lower end region of FOUP 26 when carrying-out M-number of substrates by the blade hand 8 is H, a height (the lowest height when the height are changeable) of a part, of the whole batch conveying type hand 9, which passes a region overlapping with the substrate S stored in FOUP 26 in a view of the vertical direction when conveying the substrates is h.

A preferable example for satisfying H>h while permitting the thickness of the batch conveying type hand 9 is that the diameter of the substrate S is 300 mm, the number of substrates to be held by the batch conveying type hand 9 is 3, 4, or 6, and the height h of the part, of the whole batch conveying type hand 9, which passes the region overlapping with the substrate S stored in FOUP 26 in the view of the vertical direction when conveying the substrates is 20 mm or less. For example, the height h is 10 mm or more and 20 mm or less.

Similarly, another preferable example is that the diameter of the substrate S is 300 mm, and the number of substrates to be held by the batch conveying type hand 9 is 5, and the height h of the part, of the whole batch conveying type hand 9, which passes the region overlapping with the substrate S stored in FOUP 26 in the view of the vertical direction when conveying the substrates is 60 mm or less. For example, the height h is 50 mm or more and 60 mm or less.

Similarly, another preferable example is that the diameter of the substrate S is 300 mm, and the number of substrates to be held by the batch conveying type hand 9 is 7, and the height h of the part, of the whole batch conveying type hand 9, which passes the region overlapping with the substrate S stored in FOUP 26 in the view of the vertical direction when conveying the substrates is 50 mm or less. For example, the height h is 40 mm or more and 50 mm or less.

Similarly, another preferable example is that the diameter of the substrate S is 300 mm, and the number of substrates to be held by the batch conveying type hand 9 is 6 or 9, and the height h of the part, of the whole batch conveying type hand 9, which passes the region overlapping with the substrate S stored in FOUP 26 in the view of the vertical direction when conveying the substrates is 80 mm or less. For example, the height h is 70 mm or more and 80 mm or less.

Similarly, another preferable example is that the diameter of the substrate S is 450 mm, and the number of substrates to be held by the batch conveying type hand 9 is 3, 4, or 6, and the height h of the part, of the whole batch conveying type hand 9, which passes the region overlapping with the substrate S stored in FOUP 26 in the view of the vertical direction when conveying the substrates is 24 mm or less. For example, the height h is 12 mm or more and 24 mm or less.

Similarly, another preferable example is that the diameter of the substrate S is 450 mm, and the number of substrates to be held by the batch conveying type hand 9 is 5 and the height h of the part, of the whole batch conveying type hand 9, which passes the region overlapping with the substrate S stored in FOUP 26 in the view of the vertical direction when conveying the substrates is 72 mm or less. For example, the height h is 60 mm or more and 72 mm or less.

Similarly, another preferable example is that the diameter of the substrate S is 450 mm, and the number of substrates to be held by the batch conveying type hand 9 is 7 and the height h of the part, of the whole batch conveying type hand 9, which passes the region overlapping with the substrate S stored in FOUP 26 in the view of the vertical direction when conveying the substrates is 60 mm or less. For example, the height h is 49 mm or more and 60 mm or less.

Similarly, another preferable example is that the diameter of the substrate S is 450 mm, and the number of substrates to be held by the batch conveying type hand 9 is 6 or 9 and the height h of the part, of the whole batch conveying type hand 9, which passes the region overlapping with the substrate S stored in FOUP 26 in the view of the vertical direction when conveying the substrates is 96 mm or less. For example, the height h is 84 mm or more and 96 mm or less.

Note that, when the number of substrates to be held is 25 as in FOUP 26, it is especially desirable that the number of substrates n to be held by the batch conveying type hand 9 is 5. When the number of substrates n to be held by the batch conveying type hand 9 is 5, the number of substrates to be conveyed by the batch conveying type hand 9 is n×(positive integer)=5×4=20, and the number of substrates M to be conveyed by the blade hand 8 is 5. Namely, the total number of times of conveying substrates by the end effector 5 is 9 times, summing up 5 times by the blade hand and 4 times by the batch conveying type hand.

In contrast, when the number of substrates n to be held by the batch conveying type hand 9 is 4, the number of substrates to be conveyed the batch conveying type hand 9 is n×(positive integer)=4×5=20, and the number of substrates M to be conveyed the blade hand 8 is 5. Namely, the total number of times of conveying substrates by the end effector 5 is 10 times, summing up 5 times by the blade hand 8 and 5 times by the batch conveying type hand 9, being 1 time more of conveying substrates compared to the case when n=5.

Also, when the number of substrates n to be held by the batch conveying type hand 9 is 6, the number of substrates to be conveyed the batch conveying type hand 9 is n×(positive integer)=6×3=18, and the number of substrates M to be conveyed the blade hand 8 is 7. Namely, the total number of times of conveying substrates by the end effector 5 is 10 times, summing up 7 times by the blade hand 8 and 3 times by the batch conveying type hand 9, being 1 time more of conveying substrates compared to the case when n=5.

When the number of substrates to be stored is 25 as in FOUP 26 as above, the total number of times of conveying substrates S by the end effector 5 can be minimized by setting the number of substrates n to be held by the batch conveying type hand 9 to 5.

Next, an operation for storing the substrates S carried out from FOUP 26 of a conveying source into a substrate storing shelf (substrate storing portion) 27 of a conveying destination (treatment device side) will be described, referring to FIGS. 9A to 9C.

Figure 9A:
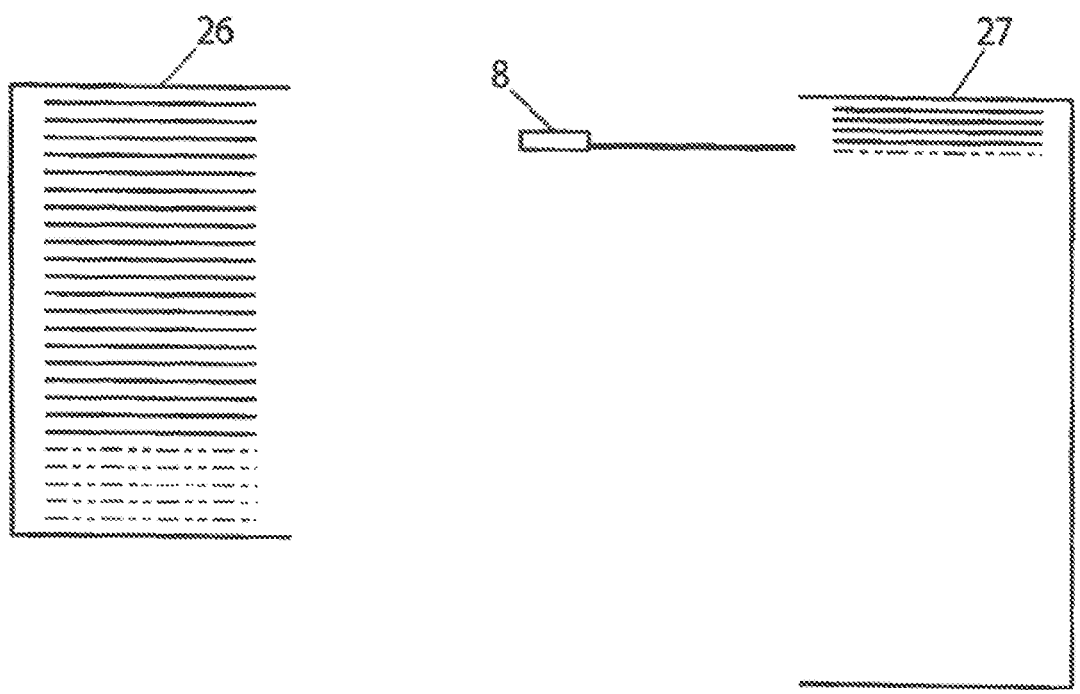
FIG. 9A is a schematic view illustrating a process for conveying a substrate carried out from the substrate storing portion (FOUP) of a conveying source using the substrate conveying robot in FIG. 1 into the substrate storing portion of a conveying destination.

In the embodiment, as illustrated in FIG. 9A, the substrate S carried out by the blade hand 8 from the lower end region of FOUP 26 of the conveying source in the above-mentioned first conveying step is carried into the upper end region of the substrate storing shelf 27 of the conveying destination.

Figure 9B:
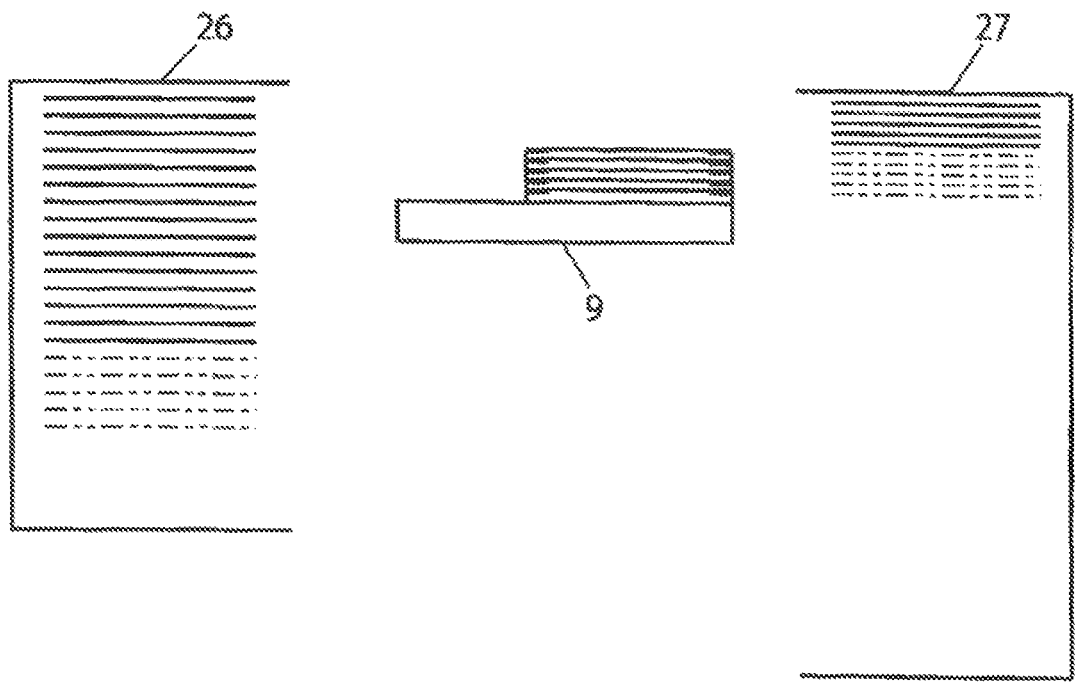
FIG. 9B is another schematic view illustrating a process for conveying a substrate carried out from a substrate storing portion (FOUP) of a conveying source using the substrate conveying robot in FIG. 1 into the substrate storing portion of a conveying destination.

Next, the substrates S carried out by the batch conveying type hand 9 from the intermediate region and the upper end region of FOUP 26 of the conveying source in the above-mentioned second conveying step is carried into the lower portion of the upper end region of the substrate storing shelf 27 of the conveying destination, as illustrated in FIG. 9B.

Here, in the example, the vertical pitch of the plurality of substrates S in a stored state is different between FOUP 26 of the conveying source and the substrate storing shelf 27 of the conveying destination. Namely, the substrate storing pitch of the substrate storing shelf 27 of the conveying destination is smaller than the substrate storing pitch in FOUP 26 of the conveying source.

Thereupon, after carrying-out the plurality of substrates S by the batch conveying type hand 9 from FOUP 26 of the conveying source in the second conveying step, the vertical pitch of the plurality of substrate supporting portions 20 is reduced in accordance with the substrate storing pitch of the substrate storing shelf 27 of the conveying destination. Thereby, the plurality of substrates S can be conveyed between substrate storing portions with different substrate storing pitches.

Note that, the number of substrates to be stored in the substrate storing shelf 27 of the conveying destination is sometimes more than the number of substrates to be stored in FOUP 26 of the conveying source (=25). For example, when the number of substrates to be stored in the substrate storing shelf 27 is 100, the substrates S are carried out from four FOUPs 26 in order and carried into the substrate storing shelf 27 of the conveying destination.

In this case, the substrates S to be carried into the upper end region of the substrate storing shelf 27 of the conveying destination are the substrates S which has been carried out from the lower end region of the first FOUP 26. In contrast, the substrates S to be carried into the lower end region of the substrate storing shelf 27 of the conveying destination is the substrates S which has been carried out from the upper end region of the fourth FOUP 26. Substrates carried out from the intermediate region/upper end region of the first FOUP 26, all regions of the second FOUP 26, all regions of the third FOUP 26, and the lower end region/intermediate region of the fourth FOUP 26, respectively are carried into the intermediate region of the substrate storing shelf 27 of the conveying destination.

Figure 9C:
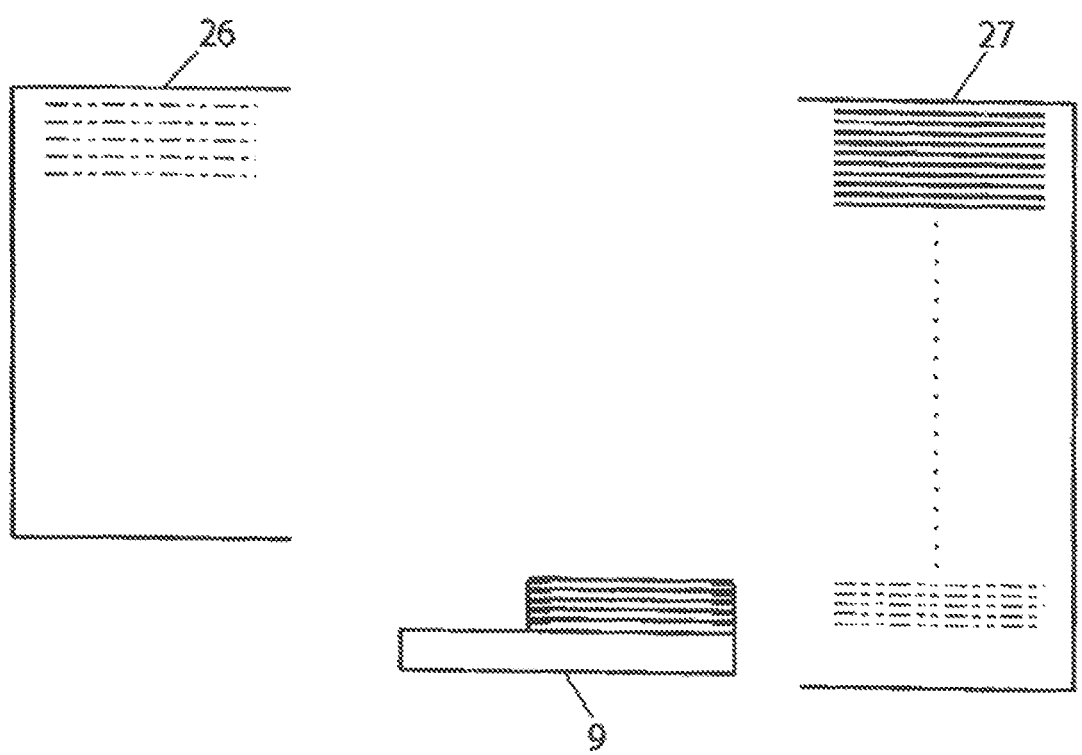
FIG. 9C is another schematic view illustrating a process for conveying a substrate carried out from a substrate storing portion (FOUP) of a conveying source using the substrate conveying robot in FIG. 1 into the substrate storing portion of a conveying destination.

Note that, as illustrated in FIG. 9C, since a space is ensured in the lower end region of the substrate storing shelf 27 of the conveying destination in the example, the batch conveying type hand 9 can be inserted into the lower end region of the substrate storing shelf 27 utilizing this space.

As a substrate conveying method according to a variation of the above-mentioned embodiment, part of, not all of, the substrates S left in FOUP 26 of the conveying source after the above-mentioned first conveying step can be carried out by the batch conveying type hand 9.

For example, part of the substrates S left in FOUP 26 of the conveying source after the first conveying step is carried out by the batch conveying type hand 9 and carried into the intermediate region in the vertical direction of the substrate storing shelf 27 of the conveying destination.

Figure 10:
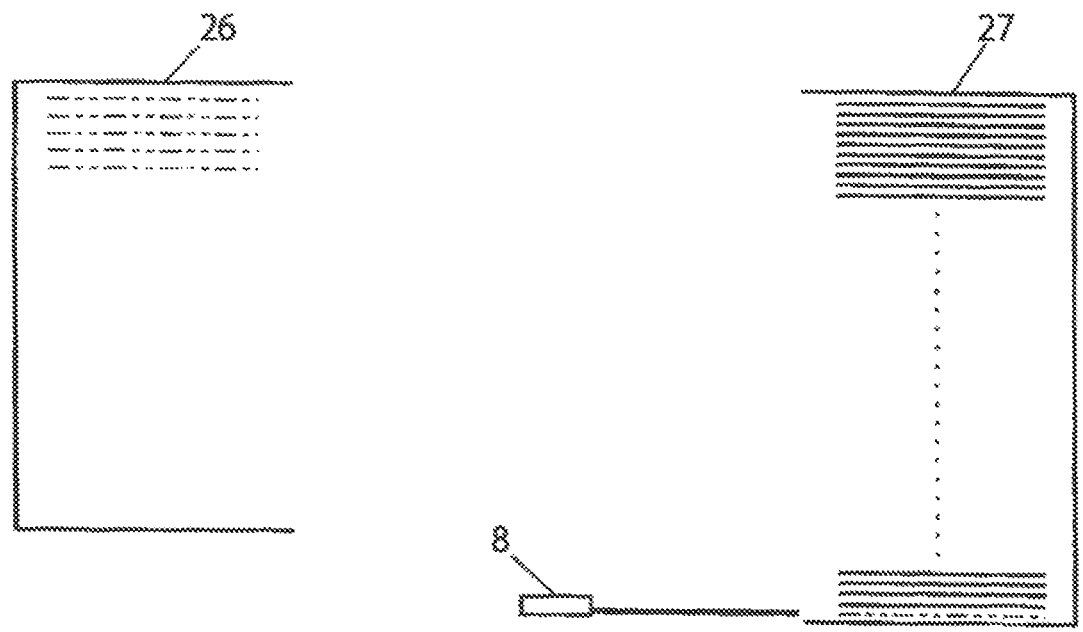
FIG. 10 is a schematic view illustrating a variation of the substrate conveying process in FIG. 9C.

Subsequently, as illustrated in FIG. 10, the substrates S left in the upper end region of FOUP 26 of the conveying source is carried out one by one by the blade hand 8, not by the batch conveying type hand 9, and carried into the lower end region of the substrate storing shelf 27 of the conveying destination.

Thereby, the substrates S can be carried in up to the lowest stage of the substrate storing shelf 27 without any problem even when a space for inserting the batch conveying type hand 9 cannot be ensured in the lower end region of the substrate storing shelf 27 of the conveying destination.

Figure 11:
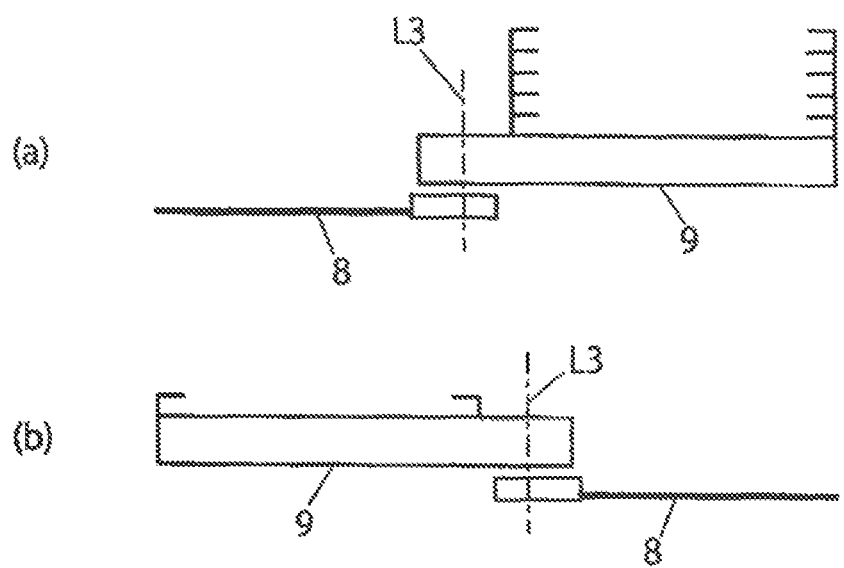
FIG. 11 is a schematic view illustrating a hand switchover mechanism of the substrate conveying robot in FIG. 1.

Note that, in the above-mentioned end effector 5, as illustrated in FIG. 11, the blade hand 8 and the batch conveying type hand 9 can be rotated independently from each other about a common axis line (third axis line L3). Thereby, the state that the batch conveying type hand 9 is positioned in the operative position and the blade hand 8 is positioned in the retreat position (FIG. 11 (a)), and the state that the blade hand 8 is positioned in the operative position and the batch conveying type hand 9 is positioned in the retreat position (FIG. 11 (b)) can be switched properly.

Figure 12:
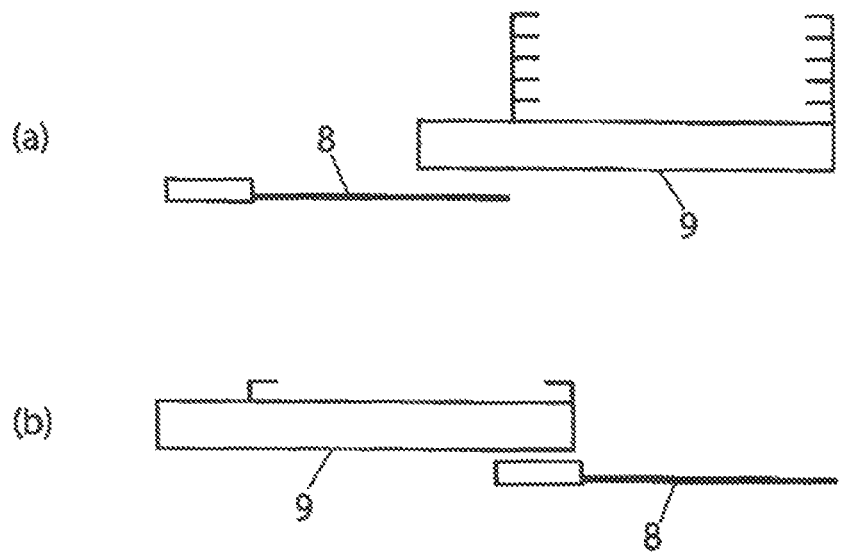
FIG. 12 is a schematic view illustrating a variation of the hand switchover mechanism in FIG. 11.

In contrast, as a variation, the blade hand 8 and the batch conveying type hand 9 can also be configured to be moved back and forth independently from each other using a linear guide and the like, as illustrated in FIG. 12.

In the configuration, the state that the batch conveying type hand 9 is advanced so as to be positioned in the operative position and the blade hand 8 is retreated so as to be positioned in the retreat position (FIG. 12 (a)), and the state that the blade hand 8 is advanced so as to be positioned in the operative position and the batch conveying type hand 9 is retreated so as to be positioned in the retreat position (FIG. 12 (b)) can be switched properly.

Figure 13:
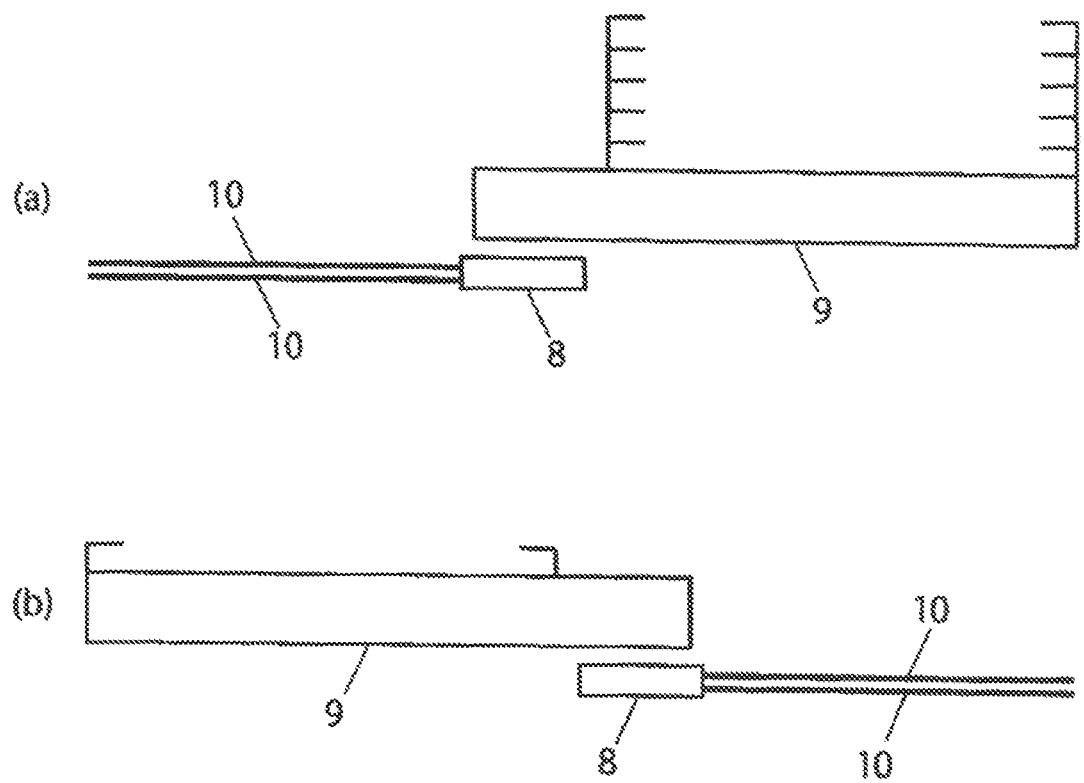
FIG. 13 is a schematic view illustrating a variation of an end effector of the substrate conveying robot in FIG. 1.
Figure 14:
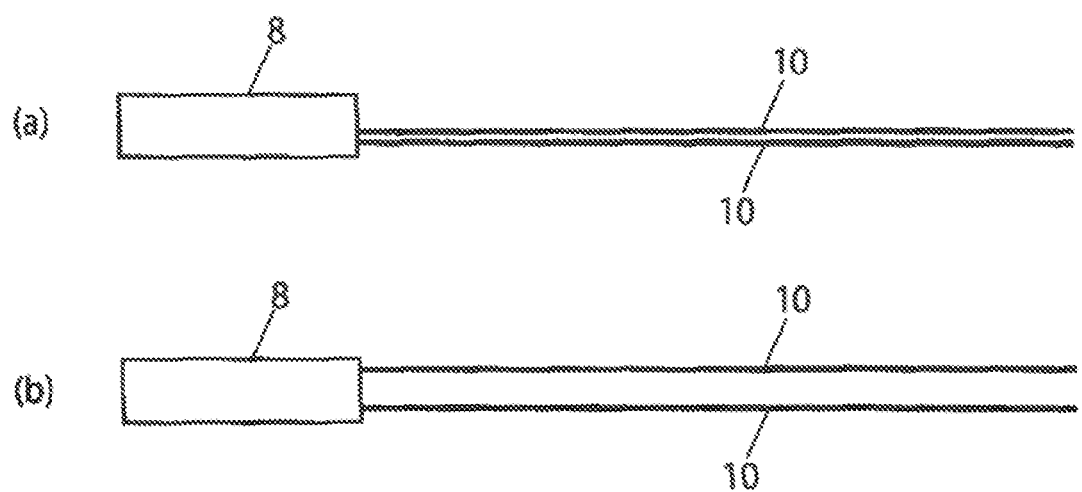
FIG. 14 is a schematic view illustrating a pitch change operation of a blade hand of the end effector in FIG. 13.

As another variation of the above-mentioned embodiment, as illustrated in FIG. 13, a plurality of hand bodies 10 can be provided to the blade hand 8. By providing the plurality of hand bodies 10 to the blade hand 8 in this way, a plurality of substrates S can be carried out from FOUP 26 simultaneously in the above-mentioned first conveying step. Thereby, the number of times of conveying substrates in the first conveying step can be decreased so as to shorten conveying time.

In the example, it is preferable that the vertical pitch of the plurality of hand bodies 10 are changeable. By making the vertical pitch of the plurality of hand bodies 10 changeable, even when the substrate storing pitch of the conveying source and the substrate storing pitch of the conveying destination are different from each other, it is possible to adapt to the difference without any problem.

As described above, according to the above-mentioned embodiment of the invention and its variations, the end effector 5 has both the blade hand 8 and the batch conveying type hand 9, and the substrate(s) S is(are) carried out using the blade hand 8 so as to ensure a space for inserting the batch conveying type hand 9 when the batch conveying type hand 9 cannot be inserted into the substrate storing portion. Thereby, a plurality of substrates can be conveyed simultaneously using the batch conveying type hand 9 without any problem even when use of the batch conveying type hand 9 is restricted due to the condition on the substrate storing portion side.

Note that, although the substrate storing portion of the conveying source is FOUP 26 and the substrate storing portion of the conveying destination is the substrate storing shelf 27 on the treatment device side in the above description, in contrast, the conveying destination can be FOUP 26 and the conveying source can be the substrate storing shelf 27 on the treatment device side. It is particularly effective when enough space for inserting the batch conveying type hand 9 cannot be ensured in the lower end region of the substrate storing shelf 27 on the treatment device side as the conveying source.

In addition, although a configuration that the substrate(s) S is(are) held on the upper surface side of each of the blade hand 8 and the batch conveying type hand 9 is described in the above-described embodiment, instead, a configuration that the substrate(s) S is(are) held on the lower surface side of each of the blade hand 8 and the batch conveying type hand 9 can also be employed.

In the example, when carrying-out a substrate by the blade hand from the substrate storing portion of the conveying source in the first conveying step, the substrate is carried out from the upper end region of the substrate storing portion of the conveying source and the substrate is carried into the lower end region of the substrate storing container of the conveying destination. Similarly, in the second conveying step, substrates carried out from the intermediate region and the lower end region of the substrate storing portion of the conveying source are carried into the intermediate region and the upper end region of the substrate storing portion of the conveying destination.

Note that, a configuration of the robot arm 4 on which the above-mentioned end effector 5 is mounted is not limited to the same, and the above-mentioned end effector can be mounted on various robot arms such as an orthogonal coordinate type, a cylindrical coordinate type, a polar coordinate type, a horizontal articulated type, or a vertical articulated type.

In addition, a configuration of the batch conveying type hand 9 is also not limited to the above-mentioned configuration, and the configurations disclosed in PTLs 1 to 3, for example, can be employed accordingly.

Figure 15:
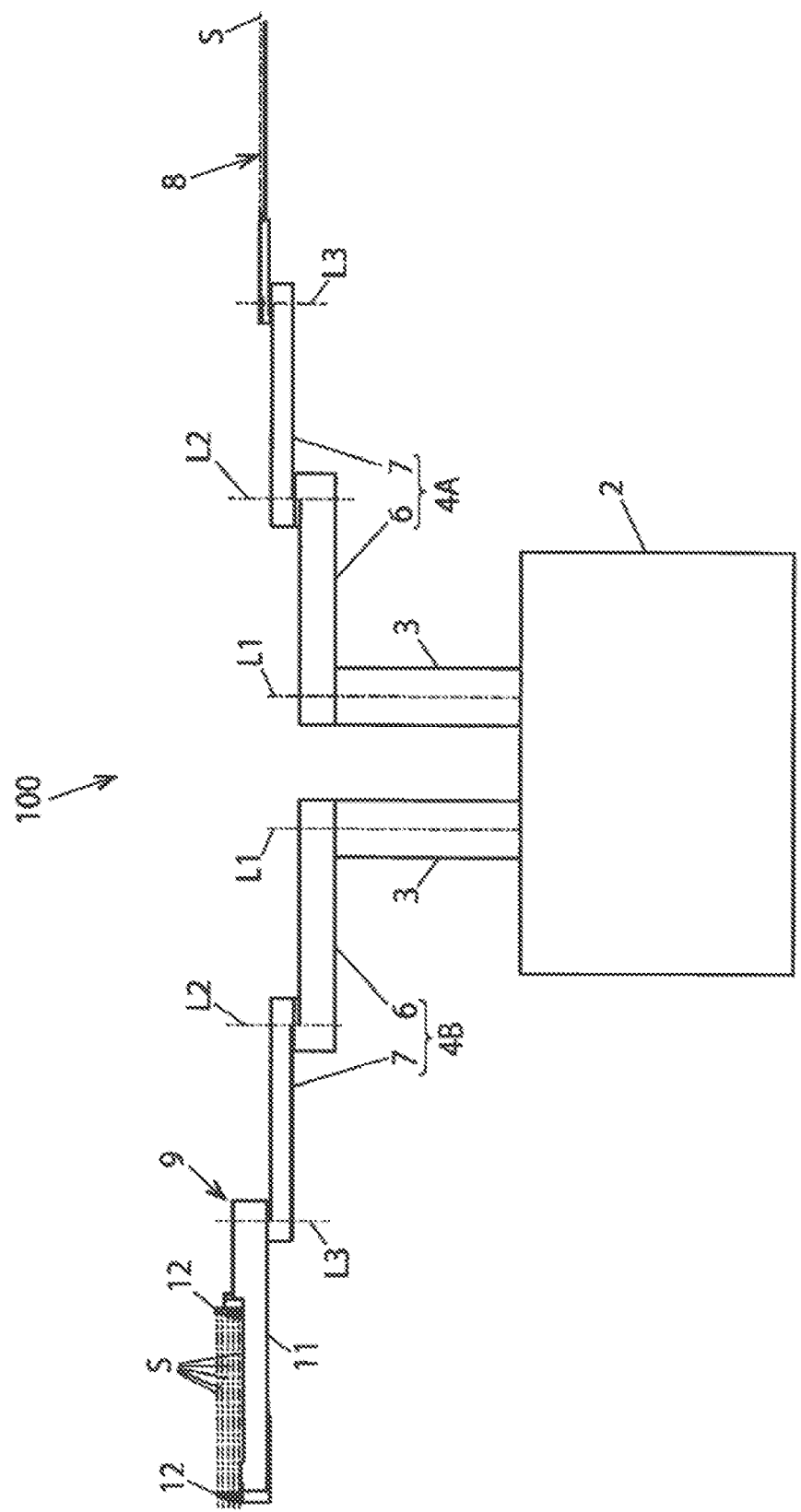
FIG. 15 is a side view illustrating a substrate conveying robot according to a variation of the embodiment above.

In addition, as another variation, in a substrate conveying robot 100 comprising a first robot arm 4A and a second robot arm 4B which can be driven independently from the first robot arm 4A, it is also possible that the above-mentioned blade hand (first hand) 8 is mounted on the first robot arm 4A, and the above-mentioned batch conveying type hand (second hand) 9 is mounted on the second robot arm 4B, as illustrated in FIG. 15.

Also in the substrate conveying robot 100 of the variation, when the batch conveying type hand 9 cannot be inserted into the substrate storing portion as with the above-described embodiment, the substrate S can be carried out using the blade hand 8 mounted on the first robot arm so as to ensure a space for inserting the batch conveying type hand 9. Thereby, a plurality of substrates can be conveyed using the batch conveying type hand 9 simultaneously without any problem even when use of the batch conveying type hand 9 is restricted due to the condition on the substrate storing portion side.

Figure 16:
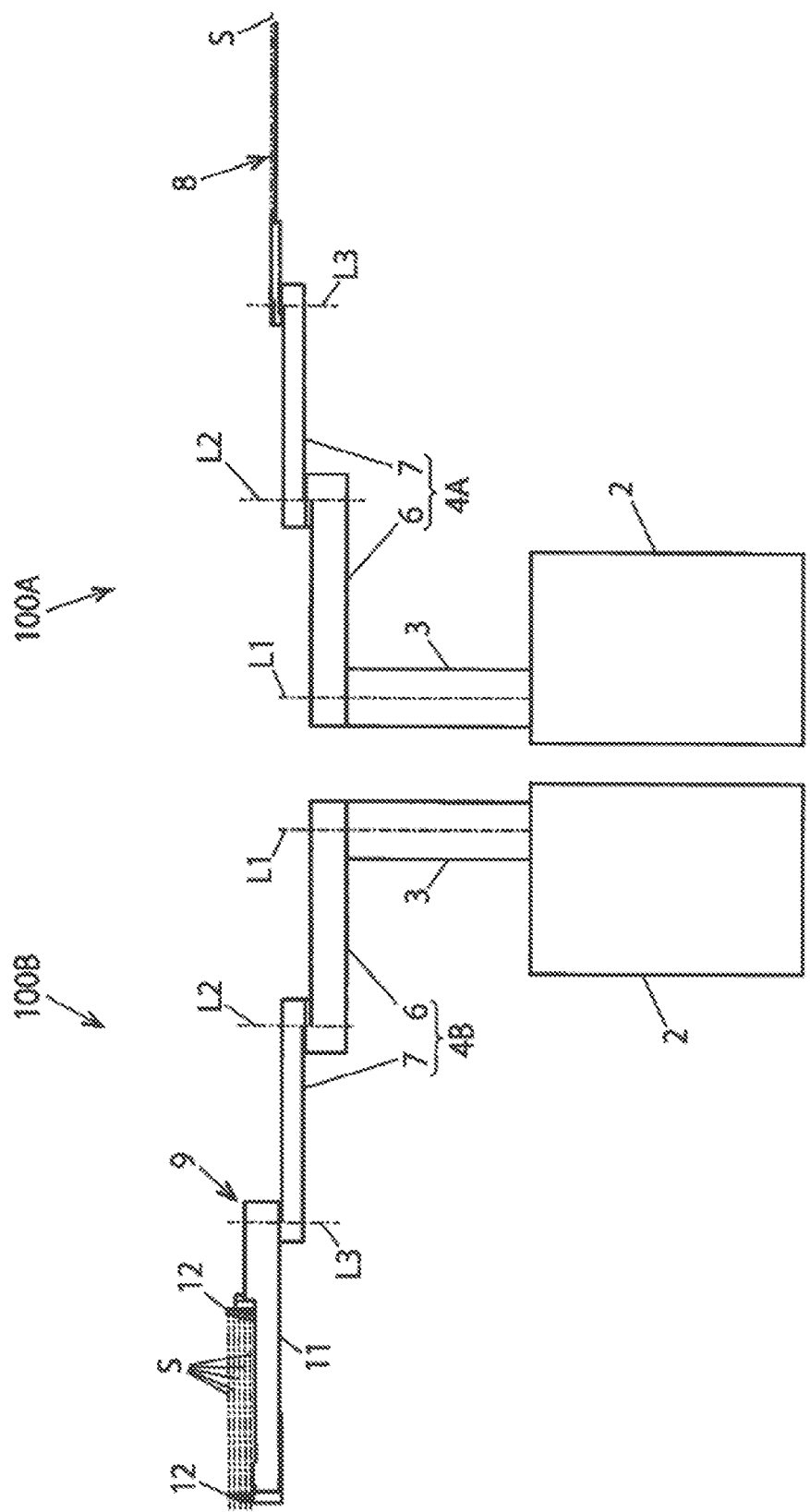
FIG. 16 is a side view illustrating a substrate conveying system according to a variation of the embodiment above.

In addition, as another variation, in the substrate conveying system comprising a first substrate conveying robot 100A and a second substrate conveying robot 100B, it is also possible that the above-mentioned blade hand (first hand) 8 is mounted on the first robot arm 4A of the first substrate conveying robot 100A and the above-mentioned batch conveying type hand (second hand) 9 is mounted on the second robot arm 4B of the second substrate conveying robot 100B, as illustrated in FIG. 16.

Also in the substrate conveying system of the variation, when the batch conveying type hand 9 cannot be inserted into the substrate storing portion, the substrate S can be carried out using the blade hand 8 of the first substrate conveying robot 100A so as to ensure a space for inserting the batch conveying type hand 9, as with the above-described embodiment. Thereby, a plurality of substrates can be conveyed simultaneously using the batch conveying type hand 9, even when use of the batch conveying type hand 9 is restricted due to the condition on the substrate storing portion side.

Figure 17:
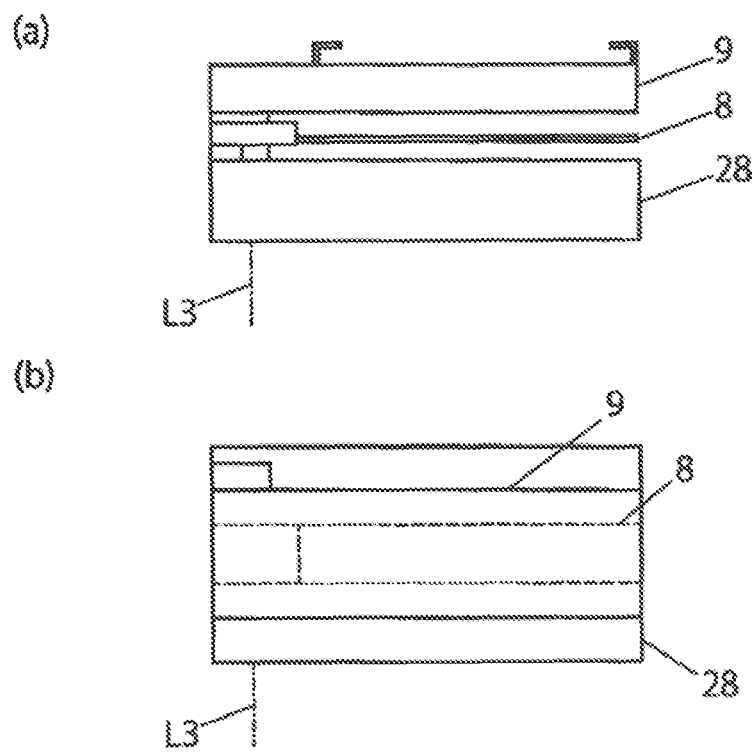
FIG. 17 is a schematic view illustrating a hand switchover mechanism of a substrate conveying robot according to a variation of the embodiment above.
Figure 18:
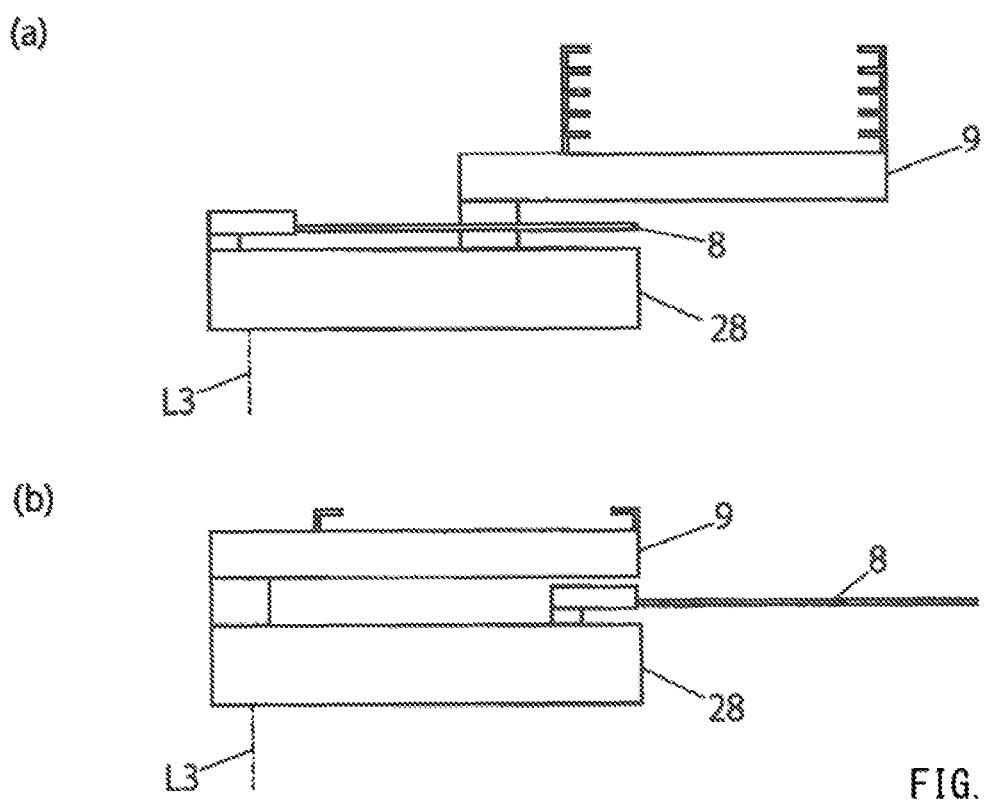
FIG. 18 is a schematic view for illustrating the hand switchover mechanism in FIG. 17.

In addition, as another variation, it is also possible that the blade hand (first hand) 8 and the batch conveying type hand (second hand) 9 are provided so as to slide independently from each other to a hand common body portion 28 provided rotatably about the third axis line L3, as illustrated in FIGS. 17 and 18.

In addition, although the interval between adjacent substrate supporting portions 20 are made changeable by configuring the substrate supporting portions 20 constructing the substrate holding means 12 of the batch conveying type hand 9 so as to be lifted and lowered as illustrated in FIGS. 6A and 6B in the above-described embodiment, the interval between adjacent substrate supporting portions 20 may be fixed as a variation. In this case, the configuration can be simplified by omitting the lifting link mechanism 23 or the like.

In addition, although adjacent substrate supporting portions 20 are arranged not to overlap with each other in a view from above as illustrated in FIG. 4 in the above-described embodiment, the adjacent substrate supporting portions 20 may be arranged so as to overlap with each other in a view from above as a variation.

Note that holding of a substrate herein means a state that a substrate can be conveyed a hand, and it also may be a state that a substrate is placed, sucked, or pinched by the hand.

REFERENCE SIGNS LIST 1, 100 . . . substrate conveying robot
100A . . . first substrate conveying robot
100B . . . second substrate conveying robot
2 . . . base
3 . . . main shaft
4 . . . robot arm
4A . . . first robot arm
4B . . . second robot arm
5 . . . end effector
6 . . . first arm member
7 . . . second arm member
8 . . . blade hand (first hand)
9 . . . batch conveying type hand (second hand)
10 . . . hand body of blade hand
11 . . . hand base portion of batch conveying type hand
12 . . . substrate holding means of batch conveying type hand
13 . . . finger portion of blade hand
14 . . . hand base portion of blade hand
15 . . . substrate supporting portion of blade hand
16 . . . gripping portion of blade hand
17 . . . abutting portion of blade hand
18 . . . movable member of blade hand
19 . . . drive source of blade hand
20 . . . substrate supporting portion of batch conveying type hand
21 . . . movable member of batch conveying type hand
22 . . . drive source of batch conveying type hand
23 . . . lifting link mechanism
24 . . . liftable member
25 . . . slider
26 . . . FOUP (substrate storing portion)
27 . . . substrate storing shelf (substrate storing portion)
28 . . . hand common body portion
L1 . . . first axis line
L2 . . . second axis line
L3 . . . third axis line
S . . . substrate (wafer)

The invention claimed is:

1. An end effector mounted on a robot arm, comprising independently drivable first and second hands,
wherein the first hand has a hand body insertable between vertically adjacent substrates stored in a substrate storing portion, the first hand being configured to hold a substrate immediately above or immediately below the hand body inserted between the vertically adjacent substrates, and
wherein the second hand has a hand base portion which at least partially advances below a lowermost substrate or above an uppermost substrate of a plurality of substrates stored in the substrate storing portion and a substrate holding unit extendable in a vertical direction relative to the hand base portion via a lifting mechanism stored inside the hand base portion over a range including two or more substrates stored in the substrate storing portion in a state that the hand base portion and the lifting mechanism stored inside the hand base portion are at least partially positioned below the lowermost substrate or above the uppermost substrate.

2. The end effector according to claim 1, wherein the first and second hands are each switchable between an operative position upon accessing the substrate storing portion and a retreat position upon not accessing the substrate storing portion.

3. The end effector according to claim 1, wherein the two or more substrates have bottom surface edge portions, respectively, and
wherein the substrate holding unit has a plurality of substrate supporting portions for supporting the bottom surface edge portions, respectively, the substrate supporting portions being arranged at different heights in a vertical direction at least in a substrate holding state.

4. The end effector according to claim 3, wherein the plurality of substrate supporting portions are changeable in vertical pitch, and wherein the substrate holding unit is configured to change in height in accordance with change in the vertical pitch of the plurality of substrate supporting portions.

5. The end effector according to claim 3, wherein the plurality of substrate supporting portions are arranged to positions where they do not overlap each other at least partially in a view from a moving direction of the substrate supporting portion.

6. The end effector according to claim 5, wherein the plurality of substrate supporting portions are changeable in vertical pitch, and wherein positions of the plurality of substrate supporting portions in a view from the vertical direction do not change even when the vertical pitch is changed.

7. The end effector according to claim 1, wherein the first hand has a plurality of hand bodies.

8. The end effector according to claim 7, wherein the plurality of hand bodies are changeable in vertical pitch.

9. The end effector according to claim 1,
wherein a diameter of the substrate is 300 mm,
the number of substrates to be held by the second hand is five, and,
of the whole second hand, a height of a part which passes a region overlapping with the substrate stored in the substrate storing portion in a view of the vertical direction when conveying the substrate is 60 mm or less.

10. The end effector according to claim 1,
wherein a diameter of the substrate is 450 mm,
the number of substrates to be held by the second hand is five, and,
of the whole second hand, a height of a part which passes a region overlapping with the substrate stored in the substrate storing portion in a view of the vertical direction when conveying the substrate is 72 mm or less.

11. The end effector according to claim 1, wherein the hand base portion is configured to remain in a same vertical position when the substrate holding unit extends in the vertical direction relative to the hand base portion.

12. A substrate conveying robot comprising the end effector according to claim 1, and a robot arm on which the end effector is mounted.

13. A substrate treating system comprising a substrate conveying system including the substrate conveying robot according to claim 12; and a substrate treating device for treating a substrate conveyed by the substrate conveying system.

14. A substrate conveying system comprising the substrate conveying robot of the invention according to claim 12 and the substrate storing portion for storing a plurality of substrates, wherein H>h and (N−M)=n×(positive integer) is established,
where the number of substrates to be stored in the substrate storing portion is N,
the number of substrates to be carried out by the first hand from one vertical end region of the substrate storing portion is M,
the number of substrates to be held by the second hand is n,
a height of a space formed in the one vertical end region of the substrate storing portion when M-number of substrates are carried out by the first hand is H, and
a height of a part, of the whole second hand, which passes a region overlapping with the substrate stored in the substrate storing portion in a view of the vertical direction when conveying the substrate is h.

15. A substrate conveying method using the substrate conveying robot according to claim 12 comprising:
a first conveying step for carrying-out one or a plurality of substrates in one vertical end region of the substrate storing portion of a conveying source by the first hand; and
a second conveying step for carrying-out a plurality of substrates simultaneously by inserting the second hand into the one vertical end region where the one or plurality of substrates has/have been carried out according to the first conveying step.

16. The substrate conveying method according to claim 15, wherein all of substrates left in the substrate storing portion of the conveying source after the first conveying step are carried out by the second hand.

17. The substrate conveying method according to claim 15 which satisfies M=N−n×(positive integer), where the number of substrates to be carried out by the first hand in the first conveying step is M, the number of substrates to be stored in the substrate storing portion is N, and the number of substrates to be held by the second hand is n.

18. The substrate conveying method according to claim 17, wherein M=5, n=5.

19. The substrate conveying method according to claim 15, wherein a substrate carried out from the one vertical end region of the substrate storing portion of the conveying source in the first conveying step is carried into one vertical end region in a substrate storing portion of a conveying destination, and
wherein the one vertical end region in the substrate storing portion of the conveying source and the one vertical end region in the substrate storing portion of the conveying destination are vertically opposite end regions.

20. The substrate conveying method according to claim 15,
wherein a part of the substrates left in the substrate storing portion of the conveying source after the first conveying step is carried out by the second hand and carried into a vertically intermediate region in a substrate storing portion of a conveying destination,
wherein a substrate left in an other vertical end region in the substrate storing portion of the conveying source is carried out by the first hand and carried into one vertical end region in the substrate storing portion of a conveying destination, and
wherein the one vertical end region in the substrate storing portion of the conveying source and the one vertical end region in the substrate storing portion of the conveying destination are vertically opposite end regions.

21. The substrate conveying method according to claim 15, wherein the plurality of substrate supporting portions of the end effector are changeable in vertical pitch, and wherein the substrate holding unit is configured to change in height in accordance with change in the vertical pitch of the plurality of substrate supporting portions, and
wherein in the second conveying step, a height of the substrate holding unit is set to a height lower than its maximum height when firstly inserting the second hand into the one vertical end region of the substrate storing portion of the conveying source.

22. The substrate conveying method according to claim 21, wherein, when the second hand is inserted into an inside of the substrate storing portion twice or more after the first conveying step, the vertical pitch of the plurality of substrate supporting portions is set to be a maximum pitch upon insertion of second time or after.

23. A substrate conveying robot comprising:
a first robot arm;
a second robot arm drivable independently from the first robot arm;
a first hand mounted on the first robot arm; and
a second hand drivable independently from the first hand and mounted on the second robot arm,
wherein the first hand has a hand body insertable between vertically adjacent substrates stored in a substrate storing portion, the first hand being configured to hold a substrate immediately above or immediately below the hand body which is inserted between the vertically adjacent substrates, and
wherein the second hand has a hand base portion which at least partially advances below a lowermost substrate or above an uppermost substrate of a plurality of substrates stored in the substrate storing portion, and a substrate holding unit extendable in a vertical direction relative to the hand base portion via a lifting mechanism stored inside the hand base portion over a range including two or more substrates stored in the substrate storing portion in a state that the hand base portion and the lifting mechanism stored inside the hand base portion are at least partially positioned below the lowermost substrate or above the uppermost substrate.

24. A substrate conveying system comprising a first substrate conveying robot and a second substrate conveying robot,
wherein the first substrate conveying robot has a first robot arm on which a first hand is mounted,
wherein the first hand has a hand body insertable between vertically adjacent substrates stored in a substrate storing portion, the first hand being configured to hold a substrate immediately above or immediately below the hand body inserted between the vertically adjacent substrates,
wherein the second substrate conveying robot has a second robot arm on which a second hand in mounted, and
wherein the second hand has a hand base portion which at least partially advances below a lowermost substrate or above an uppermost substrate of a plurality of substrates stored in the substrate storing portion, and a substrate holding unit extendable in a vertical direction relative to the hand base portion via a lifting mechanism stored inside the hand base portion over a range including two or more substrates stored in the substrate storing portion in a state that the hand base portion and the lifting mechanism stored inside the hand base portion are at least partially positioned below the lowermost substrate or above the uppermost substrate.

\* \* \* \* \*